US009024367B2

(12) United States Patent
Regan et al.

(10) Patent No.: US 9,024,367 B2
(45) Date of Patent: May 5, 2015

(54) FIELD-EFFECT P-N JUNCTION

(71) Applicant: The Regents of the University of California, Oakland, CA (US)

(72) Inventors: William Regan, Washington, DC (US); Alexander Zettl, Kensington, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 13/773,985

(22) Filed: Feb. 22, 2013

(65) Prior Publication Data

US 2013/0221415 A1    Aug. 29, 2013

Related U.S. Application Data

(60) Provisional application No. 61/603,192, filed on Feb. 24, 2012, provisional application No. 61/638,007, filed on Apr. 25, 2012.

(51) Int. Cl.
| H01L 29/68 | (2006.01) |
| H01L 31/07 | (2012.01) |
| H01L 29/66 | (2006.01) |
| H01L 31/06 | (2012.01) |

(52) U.S. Cl.
CPC ............. *H01L 29/68* (2013.01); *H01L 31/07* (2013.01); *H01L 29/66356* (2013.01); *H01L 31/06* (2013.01)

(58) Field of Classification Search
USPC ....................................................... 257/288
See application file for complete search history.

(56) References Cited

U.S. PATENT DOCUMENTS

| T953,005 | I4 | * | 12/1976 | Anantha et al. | 257/484 |
| 4,435,610 | A | * | 3/1984 | Perlman et al. | 136/255 |
| 4,503,450 | A | * | 3/1985 | Brewer | 257/218 |
| 4,847,565 | A | | 7/1989 | Hasegawa et al. | |
| 5,583,570 | A | * | 12/1996 | Yamada | 348/294 |
| 6,078,090 | A | * | 6/2000 | Williams et al. | 257/476 |
| 6,081,017 | A | * | 6/2000 | Kim et al. | 257/431 |
| 6,225,668 | B1 | * | 5/2001 | Shindo et al. | 257/368 |
| 6,833,567 | B2 | * | 12/2004 | Choi et al. | 257/135 |
| 7,419,868 | B2 | * | 9/2008 | Ou et al. | 438/237 |
| 7,531,849 | B2 | * | 5/2009 | Ryu et al. | 257/103 |
| 7,994,549 | B2 | * | 8/2011 | Kim et al. | 257/288 |
| 7,995,384 | B2 | * | 8/2011 | Ou et al. | 365/175 |

(Continued)

OTHER PUBLICATIONS

Yi Jia et al. "Achieving High Efficiency Silicon-Carbon Nanotube Heterojunction Solar Cells by Acid Doping," Nano Letters vol. 11, pp. 1901-1905 (2011).

(Continued)

*Primary Examiner* — Thao X Le
*Assistant Examiner* — J. R. Oakley
(74) *Attorney, Agent, or Firm* — Lawrence Berkeley National Laboratory

(57) ABSTRACT

This disclosure provides systems, methods, and apparatus related to field-effect p-n junctions. In one aspect, a device includes an ohmic contact, a semiconductor layer disposed on the ohmic contact, at least one rectifying contact disposed on the semiconductor layer, a gate including a layer disposed on the at least one rectifying contact and the semiconductor layer and a gate contact disposed on the layer. A lateral width of the rectifying contact is less than a semiconductor depletion width of the semiconductor layer. The gate contact is electrically connected to the ohmic contact to create a self-gating feedback loop that is configured to maintain a gate electric field of the gate.

7 Claims, 15 Drawing Sheets

(56) References Cited

U.S. PATENT DOCUMENTS

| | | | |
|---|---|---|---|
| 2002/0045331 | A1 | 4/2002 | Aminpur |
| 2003/0020133 | A1 | 1/2003 | Dahlqvist et al. |
| 2009/0230405 | A1* | 9/2009 | Yamamoto et al. ............ 257/77 |
| 2010/0154875 | A1 | 6/2010 | Borland et al. |
| 2010/0163283 | A1 | 7/2010 | Hamedi et al. |
| 2010/0320476 | A1 | 12/2010 | Cheng et al. |
| 2011/0031481 | A1* | 2/2011 | Von Wrochem et al. ....... 257/40 |
| 2011/0133211 | A1 | 6/2011 | Malhan et al. |
| 2011/0254010 | A1 | 10/2011 | Zhang |
| 2011/0272748 | A1 | 11/2011 | Kimura |
| 2012/0009721 | A1 | 1/2012 | Abbott et al. |
| 2012/0073657 | A1* | 3/2012 | El-Ghoroury et al. ........ 136/260 |
| 2012/0161106 | A1 | 6/2012 | Kim et al. |
| 2012/0305891 | A1* | 12/2012 | Nayfeh et al. .................. 257/26 |
| 2012/0312371 | A1* | 12/2012 | Rinzler et al. ................ 136/256 |
| 2013/0048948 | A1* | 2/2013 | Heo et al. ........................ 257/27 |
| 2013/0285149 | A1* | 10/2013 | Fonash et al. ................ 257/368 |
| 2013/0334501 | A1* | 12/2013 | Regan et al. .................... 257/40 |

OTHER PUBLICATIONS

W. Chen et al. "Carrier dynamics and design optimization of electrolyte-induced inversion layer carbon nanotube-silicon Schottky junction solar cell," Applied Physics Letters vol. 100, pp. 103503-(1-4) (2012).

H. Koinuma et al., "Structure and Numerical Simulation of Field Effect Solar Cell," Mat. Res. Soc. Symp. Proc., vol. 426 (1996).

G. De Cesare et al., "Experimental realization of filed effect a-Si:H solar cells," Thin Solid Films, vol. 427, pp. 166-170 (2003).

C. Wadia et al, "Materials Availability Expands the Opportunity for Large-Scale Photovoltaics Deployment," Environ. Sci. Technol., vol. 43, pp. 2072-2077 (2009).

R. B. Godfrey and M.A. Green, "655 mV open-circuit voltage, 17.6% efficient silicon MIS solar cells," Appl. Phys. Lett., vol. 34, No. 11, pp. 790-793 (1979).

N. G. Gomaa, "Photon-induced degradation in metal-insulator-semiconductor solar cells," Renewable Energy, vol. 24, pp. 529-534 (2009).

D.-K. Yeh and T. A. Demassa, "Computer Analysis of Induced-Inversion Layer MOS Solar Cells," Solid-State Electronics, vol. 27, No. 3, pp. 283-292 (1984).

V. Yu. Yerokhov and I. I. Melnyk, "Influence of External Bias on Photoelectric Properties of Silicon MIS/IL Structures," Solid-State Electronics, vol. 42, No. 6, pp. 883-889 (1998).

P. Wadhwa et al., "Electronic Junction Control in a Nanotube-Semiconductor Schottky Junction Solar Cell," Nano Lett., vol. 10, No. 12, pp. 5001-5005 (2010).

P. Wadhwa et al., "Electrolyte-Induced Inversion Layer Schottky Junction Solar Cells," Nano Lett., vol. 11, No. 6, pp. 2419-2423 (2011).

M. A. Green, "Enhancement of Schottky solar cell efficiency above its semiempirical limit," Appl. Phys. Lett., vol. 27, No. 5, pp. 287-288 (1975).

X. Li et al., "Transfer of Large-Area Graphene Films for High-Performance Transparent Conductive Electrodes," Nano Lett., vol. 9, No. 12, pp. 4359-4363 (2009).

Y.-J Yu et al., "Tuning the Graphene Work Function by Electric Field Effect," Nano Lett., vol. 9, No. 10, pp. 3430-3434 (2009).

C. R. Crowell and S. M. Sze, "Current Transport in Metal-Semiconductor Barriers," Solid-State Electronics, vol. 9, pp. 1035-1048 (1966).

Li et al., "Graphene Films with Large Domain Size by a Two-Step Chemical Vapor Deposition Process," Nano Lett., vol. 10, No. 11, pp. 4328-4334 (2010).

W. Regan et al., "Screening-Engineered Field-Effect Solar Cells," Nano Lett., vol. 12, No. 8, pp. 4300-4304 (2012).

U.S. Office Action for U.S. Appl. No. 13/607,347 mailed Nov. 12, 2013.

U.S. Office Action for U.S. Appl. No. 13/607,347 mailed Jun. 2, 2014.

* cited by examiner

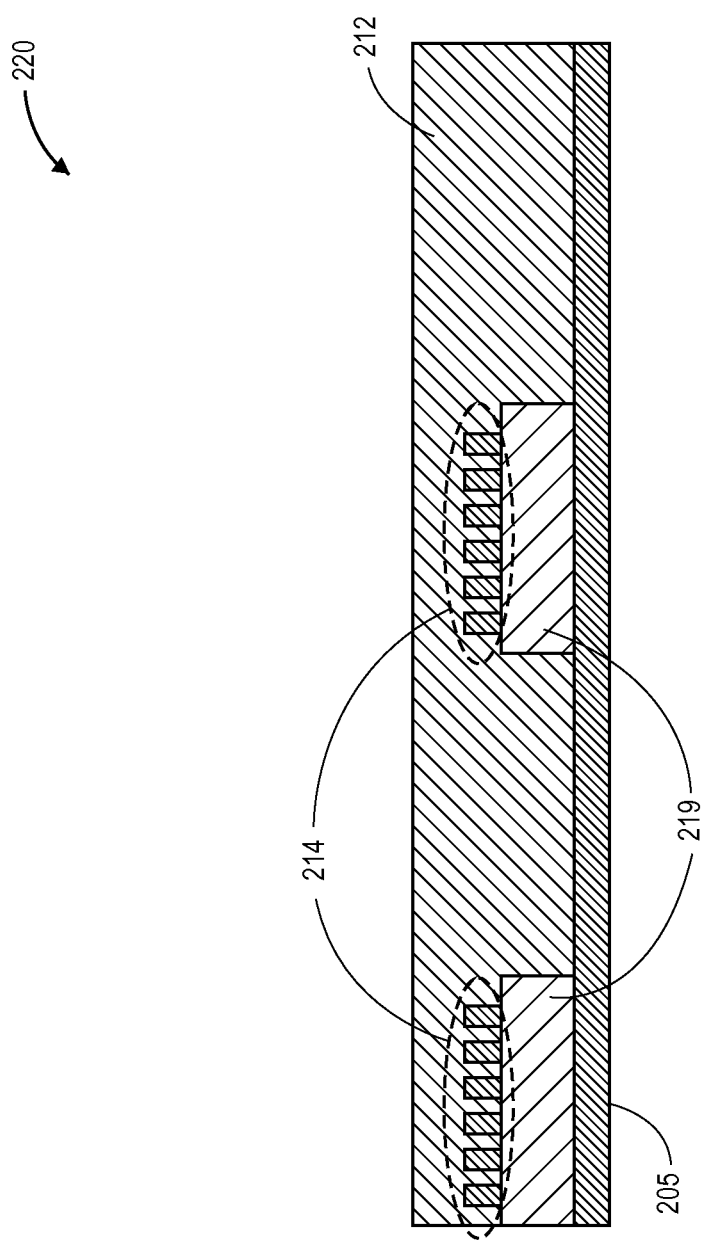

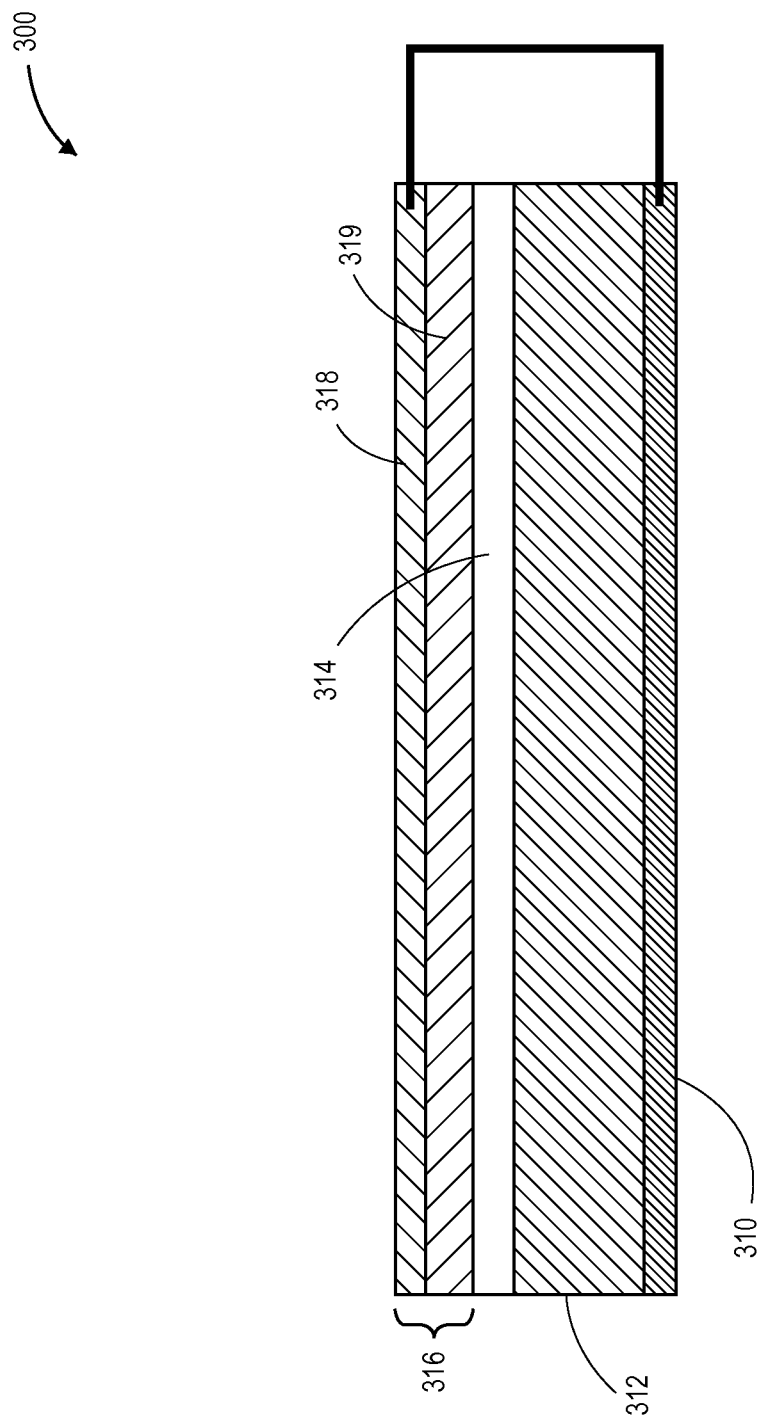

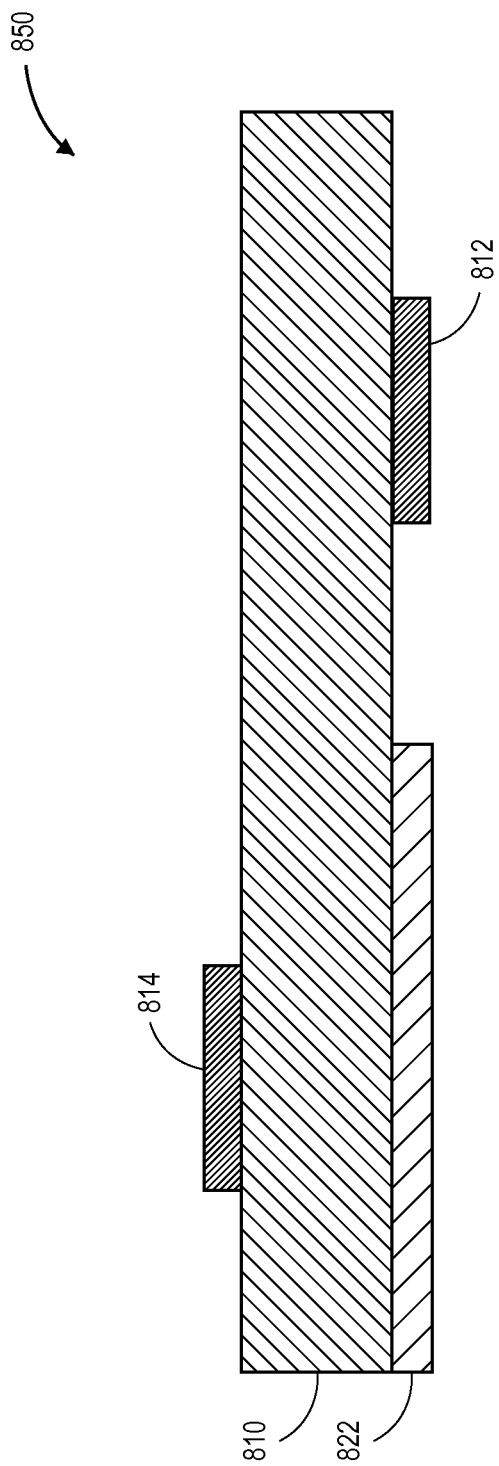

US 9,024,367 B2

FIELD-EFFECT P-N JUNCTION

RELATED APPLICATIONS

This application is related to U.S. patent application Ser. No. 13/607,347, filed Sep. 7, 2012, and claims priority under 35 U.S.C §119(e) to U.S. Provisional Patent Application No. 61/603,192, filed Feb. 24, 2012 and to U.S. Provisional Patent Application No. 61/638,007, filed Apr. 25, 2012, all of which are herein incorporated by reference.

STATEMENT OF GOVERNMENT SUPPORT

This invention was made with government support under Contract No. DE-AC02-05CH11231 awarded by the U.S. Department of Energy. The government has certain rights in this invention.

FIELD

Embodiments disclosed herein relate to the field of semiconductors, and particularly relate to field-effect p-n junctions.

BACKGROUND

Photovoltaics are a promising source of renewable energy, but current technologies face a cost to efficiency tradeoff that has slowed widespread implementation. A wide variety of photovoltaic technologies exist, but the number of fundamental architectures for separating charge remains somewhat limited.

SUMMARY

One innovative aspect of the subject matter described in this disclosure can be implemented in a device including an ohmic contact, a semiconductor layer disposed on the ohmic contact, at least one rectifying contact disposed on the semiconductor layer, a lateral width of the rectifying contact being less than a semiconductor depletion width of the semiconductor layer, and a gate including a layer disposed on the at least one rectifying contact and the semiconductor layer and a gate contact disposed on the layer. The gate contact is electrically connected to the ohmic contact to create a self-gating feedback loop that is configured to maintain a gate electric field of the gate.

In some embodiments, the semiconductor layer includes an inorganic semiconductor. In some embodiments, the rectifying contact includes a metal, a semi-metal, or a semiconductor. In some embodiments, the layer includes an inorganic dielectric layer. In some embodiments, the layer includes a material including an electric charge configured to produce an effective gate electric field of the gate. In some embodiments, the layer includes a ferroelectric material. In some embodiments, the device further includes treating agents disposed between the semiconductor layer and the layer, wherein the treating agents are configured to introduce additional band bending in the semiconductor layer.

Another innovative aspect of the subject matter described in this disclosure can be implemented in a device including an ohmic contact, a semiconductor layer disposed on the ohmic contact, a top contact disposed the semiconductor layer, with an out of plane thickness of the top contact being less than a Debye screening length of the top contact, and a gate including a layer disposed on the top contact and a gate contact disposed on the top contact. The gate contact is electrically connected to the ohmic contact to create a self-gating feedback loop that is configured to maintain a gate electric field of the gate.

In some embodiments, the semiconductor layer includes an inorganic semiconductor. In some embodiments, the top contact includes a metal, a semi-metal, or a semiconductor. In some embodiments, the layer includes an inorganic dielectric material. In some embodiments, the layer includes a material including an electric charge configured to produce an effective gate electric field of the gate. In some embodiments, the layer includes a ferroelectric material.

Another innovative aspect of the subject matter described in this disclosure can be implemented in a device including a semiconductor layer, a thickness of the semiconductor layer being comparable to a semiconductor depletion width of the semiconductor layer, an ohmic contact disposed on a first side of the semiconductor layer, a rectifying contact disposed on the first side the semiconductor layer, the rectifying contact being electrically isolated from the ohmic contact, and a gate including a layer disposed on a second side of the semiconductor layer and an electrode disposed on the layer. The gate is aligned with the rectifying contact. The gate is configured to create a non-shunted, gate-inverted current pathway through the semiconductor layer from the rectifying contact to the ohmic contact.

In some embodiments, the semiconductor layer includes an inorganic semiconductor. In some embodiments, the rectifying contact includes a metal, a semi-metal, or a semiconductor. In some embodiments, the layer includes an inorganic dielectric material. In some embodiments, the gate contact is electrically connected to the ohmic contact to create a self-gating feedback loop that is configured to maintain a gate electric field of the gate. In some embodiments, the layer includes a material including an electric charge configured to produce an effective gate electric field of the gate. In some embodiments, the layer includes a ferroelectric material.

Another innovative aspect of the subject matter described in this disclosure can be implemented in device including an ohmic contact, a semiconductor layer disposed on the ohmic contact, at least one rectifying contact disposed on the semiconductor layer, a lateral width of the rectifying contact being less than a semiconductor depletion width of the semiconductor layer, and a gate including a layer disposed on the at least one rectifying contact and the semiconductor layer. The layer includes a material including an electric charge configured to produce an effective gate electric field of the gate.

In some embodiments, the layer includes a ferroelectric material. In some embodiments, the device further includes treating agents disposed between the semiconductor layer and the layer, wherein the treating agents are configured to introduce additional band bending in the semiconductor layer.

Another innovative aspect of the subject matter described in this disclosure can be implemented in a device including an ohmic contact, a semiconductor layer disposed on the ohmic contact, a top contact disposed on the semiconductor layer, with an out of plane thickness of the top contact being less than a Debye screening length of the top contact, and a gate including a layer disposed on the top contact. The layer includes a material including an electric charge configured to produce an effective gate electric field of the gate.

In some embodiments, the layer includes a ferroelectric material. In some embodiments, the device further includes treating agents disposed between the semiconductor layer and the layer, wherein the treating agents are configured to introduce additional band bending in the semiconductor layer.

Details of one or more embodiments of the subject matter described in this specification are set forth in the accompanying drawings and the description below. Other features, aspects, and advantages will become apparent from the description, the drawings, and the claims. Note that the relative dimensions of the following figures may not be drawn to scale.

BRIEF DESCRIPTION OF THE DRAWINGS

FIG. 2 shows an example of a cross-sectional schematic illustration of a back contact field-effect p-n junction.

FIG. 3 shows an example of a cross-sectional schematic illustration of a type B field-effect p-n junction.

FIGS. 10-12 show examples of cross-sectional schematic illustrations of field-effect p-n junctions.

DETAILED DESCRIPTION

Introduction

Figure 1A:
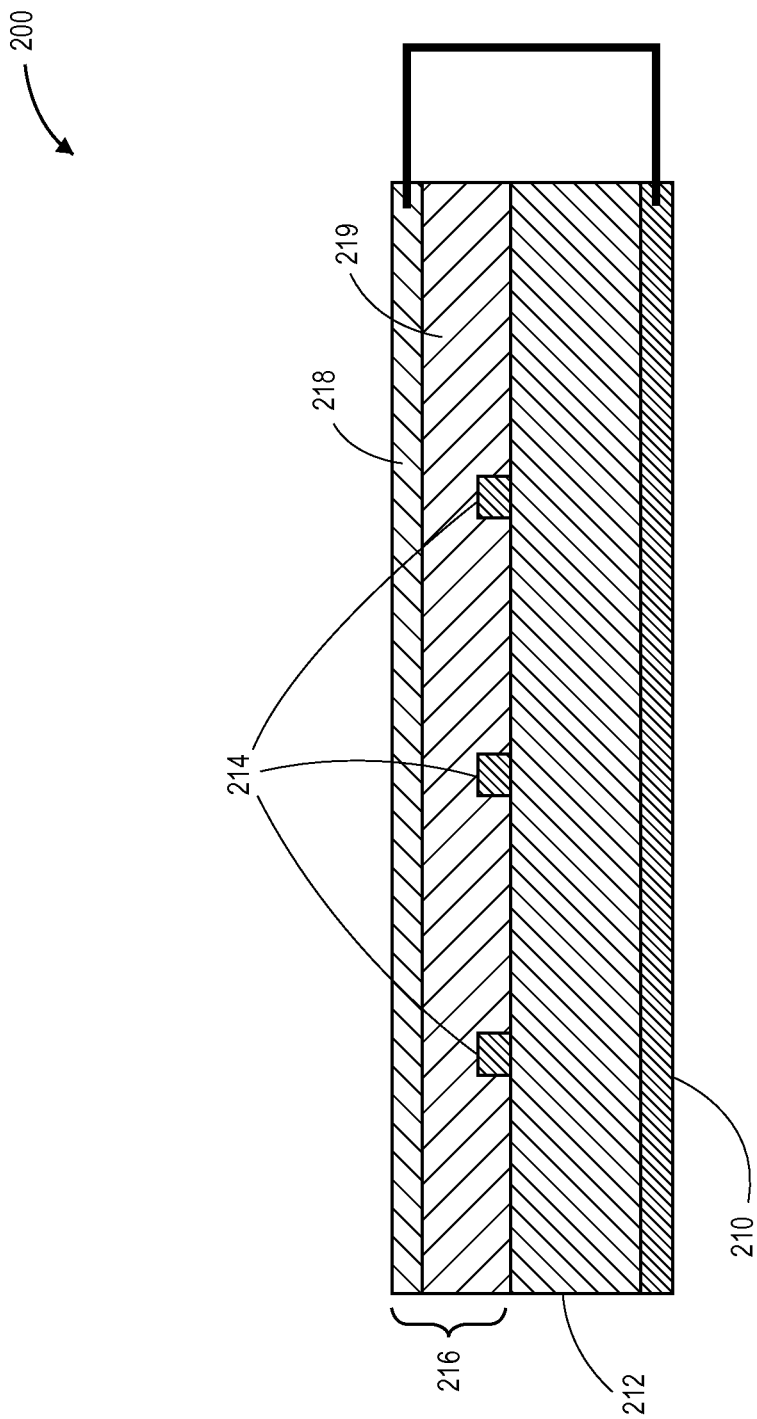
FIG. 1A shows an example of a cross-sectional schematic illustration of a type A field-effect p-n junction.

Some devices use p-n homojunctions (e.g., crystalline silicon, III-V), p-i-n homojunctions (e.g., amorphous silicon), and heterojunctions (e.g., CdTe, CIGS, polymers, Schottky barriers). However, the doping process may be energy-intensive and can damage the crystal, reducing cell output.

Field-effect doping is a promising alternative strategy to chemical doping, an expensive process and one which is not possible in many materials; most examples of field-effect doping to date, however, suffer from device instability or fundamental efficiency limitations ultimately due to screening of the gate by the top contact. The field effect, wherein a metal gate creates Fermi-level shifts in a nearby semiconductor, is far less commonly discussed in this context, but it can in fact produce a significant photovoltaic effect [1,2]. Since holding a gate at a constant voltage can use little current and hence negligible power, this approach is practical for power-generation applications. However, prior examples of field-effect doping suffered from device instability or fundamental efficiency limitations due to reliance on large metal-semiconductor Schottky barriers.

In addition to considerable energy (and cost) savings in device fabrication, one advantage of the field-effect architecture is that it does not require doping. This is an important consideration, since many of the most promising low cost and abundant semiconductors for solar cells cannot be doped to the opposite polarity, including earth-abundant metal oxides and sulfides [3]. Other semiconductors (e.g., such as amorphous silicon) can be doped but with the expense of degraded properties.

Another advantage of the field-effect architecture is that, with the built-in field provided by the gate rather than by material interfaces, there is more flexibility in choosing materials to optimize other parameters such as stability, light propagation, interface quality, and processing costs. For example, the CdS-CdTe junction is important for generating the field in CdTe solar cells. Therefore CdS, even though it absorbs and wastes some of the incoming light, cannot be replaced with a more transparent material.

There has been sporadic work using the field effect in solar cells. Metal-insulator-semiconductor (MIS) solar cells typically use uncompensated fixed charges in a dielectric to increase the semiconductor band bending at the MIS interface, functioning in a similar way to a gate [4]. Unfortunately, these have short operating lifetimes due to the thin and unstable tunnel oxide [5]. Hybrid MIS-inversion layer (MIS-IL) cells have made use of a true gate to invert the regions between MIS contacts [6,7]. Successful implementation of gating has also been demonstrated with amorphous Si field-effect cells, which use a gate to bend a region of intrinsic amorphous Si into n-type or p-type [1,2]. These designs, however, have all used wide top contacts that would locally screen the gate. Since the semiconductor areas below the contacts are screened from the field effect, these devices instead rely on other strategies in addition to the gate, such as doping at the contacts [1,2], a significant Schottky barrier at the contacts [4, 7].

A recent study [8,9] using carbon-nanotube contacts and an electrolyte gate has taken advantage of certain field-effect strategies without clarifying the general principles at work. By allowing the gate field to invert regions between the contacts and also partially penetrate the contacts, these cells can achieve high efficiencies.

Devices

Through control of the screening properties of the top electrodes, high quality field-induced p-n junctions on a wide variety of semiconductors using non-destructive lithography (or electrospinning, drop casting, spin coating, etc. of nanowires, for example) and material (e.g., metal, dielectric) deposition can be fabricated. This new architecture offers the benefits of previously demonstrated MIS or field-induced junctions (e.g., energy savings in fabrication and no doping-related crystal damage), but also relaxes the limitation of top contact Schottky barrier heights. This flexibility may allow many previously impossible p-n homojunctions to be constructed, such as those using difficult-to-dope I-VI and II-VI compound semiconductors (e.g., namely low cost metal oxides).

Embodiments disclosed herein provide field-effect doped photovoltaics that reduce or minimize screening, called screening-engineered field-effect photovoltaic (SFPV) architectures. The SFPV structure enables simple, inexpensive, and scalable fabrication of high efficiency single junction photovoltaics in a wide variety of singly-doped semiconductors, including several hard-to-dope low-cost and earth-abundant semiconductors (e.g., metal oxides). Furthermore, some embodiments provide a self-gating configuration which eliminates the need for a third electrode (e.g., gate electrode or gate contact), solving several issues in practical implementation of SFPV devices.

Some embodiments allow for managing the electrode screening and allow the field effect on its own to create the junction. Some embodiments also power the gate without an external source. Some embodiments may be referred to as screening-engineered field-effect photovoltaics (SFPV). By relaxing the typical constraints on contacts and materials, some embodiments enable gate control of an electrically-contacted, high quality p-n junction in a wide variety of singly-doped semiconductors, many of which had been previously unusable for practical photovoltaic energy conversion, with a range of contact materials.

Minimal screening of an applied gate field by the top contact, which allows for simultaneous electrical contact to and carrier modulation of the top surface of the semiconductor, is achieved by restricting one dimension of the top metal contact, in accordance with some embodiments. This can be achieved in two distinct ways, either by limiting the lateral width or the width (referred to herein as type A devices) or the out-of-plane thickness or the thickness (referred to herein as type B devices) of the metal contact. Type A and type B devices are referred to throughout this specification. In both devices, the gate dielectric can conveniently serve a dual role as the antireflective coating (ARC), but specifics of such design considerations are not addressed herein.

In type A devices, a gate field is applied through a very narrow rectifying contact, also referred to as a top contact, a finger, or a nanofinger. If the rectifying contact is sufficiently narrow relative to the semiconductor depletion width, a sufficient gate field can create a low resistance inversion layer between the rectifying contacts and deplete the semiconductor beneath the rectifying contacts, creating a p-n junction and pinching off this shunt path through the semiconductor. Current flows through the rectifying contacts to the adjacent inverted region, through the depletion region, and into the unaffected, as-doped region of the semiconductor. In type B devices, the out of plane thickness of the top contact is chosen to be thinner than its Debye screening length, in order to allow electric fields to penetrate and deplete/invert the underlying semiconductor.

FIG. 1A shows an example of a cross-sectional schematic illustration of a type A field-effect p-n junction. As shown in FIG. 1A, in some embodiments a field-effect p-n junction 200 includes an ohmic contact 210, a semiconductor layer 212 disposed on the ohmic contact 210, at least one rectifying contact 214 disposed on the semiconductor layer 212, and a gate 216 disposed on the rectifying contact 214 and semiconductor layer 212. The lateral width or width of the rectifying contacts 214 is less than the semiconductor depletion width of the semiconductor layer 212 (e.g., about 0.5 microns to 1.5 microns, depending on the semiconductor). For example, depending on the semiconductor layer 212, the rectifying contacts 214 may be about 50 nanometers (nm) to 500 nm wide, or about 250 nm wide. In some embodiments, the rectifying contacts 214 may be strips of material or lines of material disposed on the semiconductor layer 212. In some embodiments, each of the rectifying contacts 214 may be about 50 microns to 150 microns long, or about 100 microns long. When more than one rectifying contact 214 is present, the rectifying contacts may have a distance of about 1 micron to 20 microns, about 5 microns to 20 microns, about 5 microns, or about 20 microns, between adjacent rectifying contacts. The number of rectifying contacts disposed on the semiconductor layer is defined by the width of the rectifying contacts and the distance between adjacent rectifying contacts. For example, the number of rectifying contacts disposed on the semiconductor layer may be about 1 to 50, or about 25. In some embodiments, there may be about 1 to 1,000,000 rectifying contacts per square centimeter of the semiconductor layer.

In some embodiments, the gate 216 includes a gate contact 218 that is electrically connected to the ohmic contact 210, resulting in a self-gating feedback loop that is configured to maintain a gate electric field of the gate 216. In some embodiments, the gate 216 includes a layer 219 disposed on the semiconductor layer 212 and the rectifying contacts 214 and the gate contact 218 disposed on the layer 219. In some embodiments, the layer 219 may include a dielectric layer or an electrolyte.

Figure 1B:
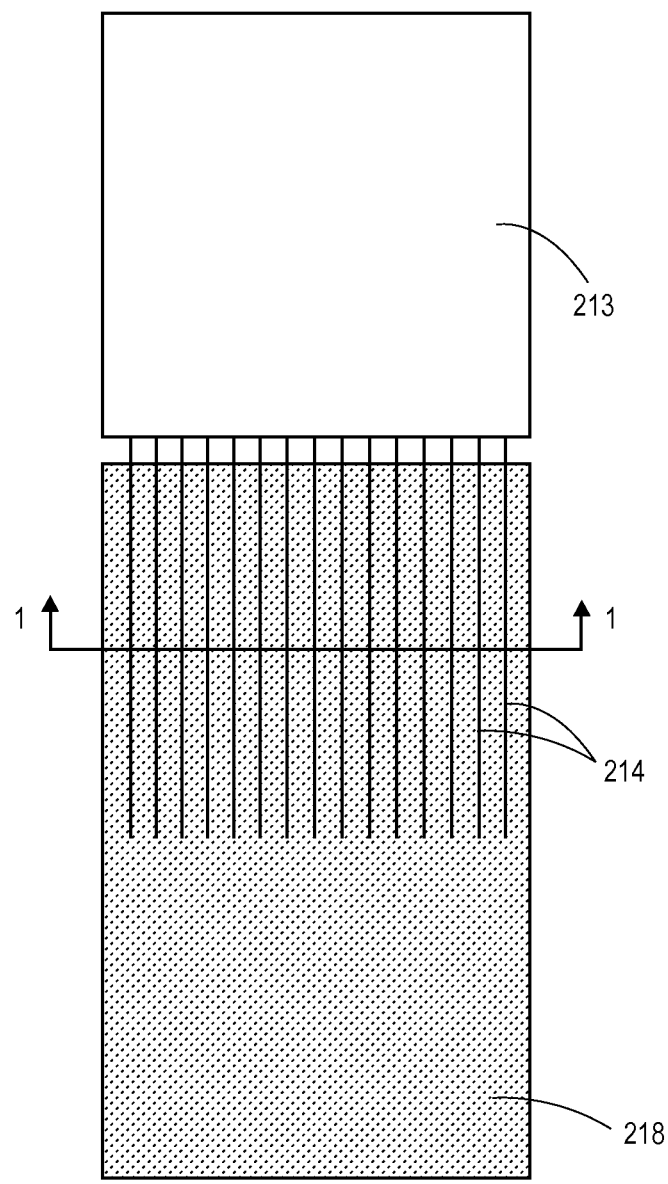
FIG. 1B shows an example of a top-down view of a portion of a type A field-effect p-n junction.

FIG. 1B shows an example of a top-down view of a portion of a type A field-effect p-n junction. FIG. 1A is the cross-sectional view though line 1-1 of FIG. 1B. Shown in FIG. 1B is an example of one possible configuration of the layout of rectifying contacts 214, a contact 213 of the rectifying contacts 214, and a gate contact 218 of a type A field-effect p-n junction. Other materials/layers in the type A field-effect p-n junction are not shown in FIG. 1B for clarity. The gate contact 218 may extend past the rectifying contacts 214, and electrical contact may be to this portion of the gate contact 218 that extends past the rectifying contacts. The rectifying contacts 214 are electrically connected to the contact 213.

In some embodiments, the ohmic contact 212 may be metal. For example, the ohmic contact may include Cr, Cu, Ni, Fe, In, Au, Al, Ag, C, Ti, Mg, Mn, or Zn. The ohmic contact of any of the other devices disclosed herein may also include any of the ohmic contact materials described above.

In some embodiments, the semiconductor layer 212 is an n-type semiconductor or a p-type semiconductor. In some embodiments, the n-type semiconductor or the p-type semiconductor may be doped to a level of about $10^{13}/cm^3$ to $10^{17}/cm^3$, about $10^{15}/cm^3$, or about $10^{16}/cm^3$. In some embodiments, the semiconductor layer 212 may be about 1 micron to 15 microns thick or about 10 microns thick. In some embodiments, the semiconductor layer 212 includes an inorganic semiconductor. In some embodiments, the inorganic semiconductor is selected from the group consisting of Si, Ge, CdTe, CdS, GaAs, $In_xGa_yN$, $Cu_xO$, $Cu_xS$, copper-indium-gallium-selenium (CIGS), $FeS_2$, $Fe_xO_y$, InP, NiS, $Zn_3P_2$, SnS, copper-zinc-tin-sulfur (CZTS), and PbS.

In some embodiments, the semiconductor layer 212 includes an organic semiconductor. In some embodiments, the organic semiconductor is selected from the group consisting of pentacene, poly(3-hexylthiophene) (P3HT), and [6,6]-phenyl-$C_{61}$-butyric acid methyl ester (PCBM).

The semiconductor layer of any of the other devices disclosed herein may also include any of the semiconductor layer materials described above.

In some embodiments, the rectifying contacts 214 include a metal. In some embodiments, the metal is selected from the group consisting of Cr, Cu, Ni, Fe, In, Au, Al, Ag, C, Ti, Mg, Mn, and Zn.

In some embodiments, the rectifying contacts 214 include a semi-metal. In some embodiments, the semi-metal is selected from the group consisting of Bi and Sn. In some embodiments, the semi-metal is selected from the group consisting of monolayer graphene and few-layer graphene.

In some embodiments, the rectifying contacts 214 include a semiconductor. In some embodiments, the semiconductor includes an inorganic semiconductor. In some embodiments, the inorganic semiconductor is selected from the group consisting of Si, Ge, CdTe, CdS, GaAs, $In_xGa_yN$, $Cu_xO$, $Cu_xS$, copper-indium-gallium-selenium (CIGS), $FeS_2$, $Fe_xO_y$, InP, NiS, $Zn_3P_2$, SnS, copper-zinc-tin-sulfur (CZTS), and PbS. In some embodiments, the semiconductor includes an organic semiconductor. In some embodiments, the organic semiconductor is selected from the group consisting of pentacene, poly(3-hexylthiophene) (P3HT), and [6,6]-phenyl-$C_{61}$-butyric acid methyl ester (PCBM).

The rectifying contacts of any of the other devices disclosed herein may also include any of the rectifying contact materials described above.

In some embodiments, the layer 219 may be about 1 nm to 150 nm thick, or about 100 nm thick. In some embodiments, the layer 219 may include a dielectric layer. In some embodiments, the dielectric layer includes an inorganic material. In some embodiments, the inorganic material is selected from the group consisting of $Al_2O_3$, $SiO_2$, $Si_3N_4$, $SiO_xN_y$, $SiN_y$, $Ta_2O_5$, $SrTiO_3$, $HfO_2$, $MgF_2$, and high-k dielectrics.

In some embodiments, the dielectric layer includes an organic material. In some embodiments, the organic material includes a polymer. In some embodiments, the polymer is selected from the group consisting of poly(methyl methacrylate (PMMA), polyethyleneimine (PEI), and polystyrene (PS).

The layer of any of the other devices disclosed herein may also include any of the layer materials described above.

In some embodiments, the gate contact 218 may be about 5 nm to 20 nm thick, or about 12 nm thick. In some embodiments, the gate contact 218 includes a semitransparent metal. In some embodiments, the semitransparent metal includes a thin metal layer. In some embodiments, the thin metal layer is selected from the group consisting of Cr, Cu, Ni, Fe, In, Au, Al, Ag, C, Ti, Mg, Mn, and Zn.

In some embodiments, the gate contact 218 includes a transparent conducting oxide (TCO). In some embodiments, the TCO is selected from the group consisting of tin-doped indium-oxide (ITO), zinc tin oxide (ZTO), and aluminum-doped zinc oxide (AZO).

In some embodiments, the gate contact 218 includes a semi-metal. In some embodiments, the semi-metal is selected from the group consisting of mono-layer graphene and few-layer graphene.

The gate contact of any of the other devices disclosed herein may also include any of the gate contact materials described above.

In some embodiments, the gate 216 includes an ionic gel. In these embodiments, the gate contact may not be present, and electrical connection may be made directly to the ionic gel. In some embodiments, the ionic gel includes an ionic liquid mixed with at least one thickening agent. In some embodiments, the thickening agent is selected from the group consisting of diblock copolymers and triblock copolymers.

In some embodiments, the gate 216 includes an anti-reflective coating (not shown) disposed thereon, where the anti-reflective coating allows an increased amount of light or a maximum amount of light to propagate into the semiconductor layer 212.

The gate of any of the other devices disclosed herein may also include any of the gate materials described above.

FIG. 2 shows an example of a cross-sectional schematic illustration of a back contact field-effect p-n junction. As shown in FIG. 2, in some embodiments a field-effect p-n junction 220 includes a contact 205. Separate strips or lines of layer 219 are disposed on the contact 205, with rectifying contacts 214 disposed on each of the separate layers 219. In some embodiments, the separate strips of layer 219 may include dielectric layers or an electrolyte. In some embodiments, a width of a strip of layer 219 may be about 0.1 microns to 20 microns. In some embodiments, one or more strips of layer 219 may be disposed on the contact 205.

The layers 219 are spaced apart from each other, accounting for depletion widths and minority carrier diffusion lengths of the semiconductor layer 212. For example, in some embodiments, the layers 219 may be spaced from each other by about 0.1 microns to 100 microns. The contact 205 may be metal. For example, the contact may include Cr, Cu, Ni, Fe, In, Au, Al, Ag, C, Ti, Mg, Mn, and Zn. The contact 205 may function as both a gate contact (e.g., in regions having the layers 219 disposed thereon) and as an ohmic contact (e.g., in regions not having the layers 219 disposed thereon).

FIG. 3 shows an example of a cross-sectional schematic illustration of a type B field-effect p-n junction. As shown in FIG. 3, in some embodiments a field-effect p-n junction 300 includes an ohmic contact 310, a semiconductor layer 312 disposed on the ohmic contact 310, a top contact 314 disposed on the semiconductor layer 312, and a gate 316 disposed on the top contact 314. The out of plane thickness of the thickness of the top contact 314 is less than the Debye screening length of the top contact 314. In some embodiments, the out of plane thickness of the top contact 314 is about 0.1 nm to 10 nm, depending on the material of the top contact. In some embodiments, the gate 316 includes a gate contact 318 that is electrically connected to the ohmic contact 310, resulting in a self-gating feedback loop that is configured to maintain a gate electric field of the gate 316. In some embodiments, the gate 316 includes a layer 319 disposed the top contact 314 and the gate contact 318 disposed on the layer 319. In some embodiments, the layer 319 may include a dielectric layer or an electrolyte.

In some embodiments, the top contact 314 includes a semi-metal layer. In some embodiments, the semi-metal layer is selected from the group consisting of mono-layer graphene and few-layer graphene.

In some embodiments, the top contact 314 includes a thin metal layer. In some embodiments, the thin metal layer is selected from the group consisting of Cr, Cu, Ni, Fe, In, Au, Al, Ag, C, Ti, Mg, Mn, and Zn.

In some embodiments, the top contact 314 includes a thin semiconductor layer. In some embodiments, the thin semiconductor layer includes an inorganic semiconductor. In some embodiments, the inorganic semiconductor is selected from the group consisting of Si, Ge, CdTe, CdS, GaAs, $In_xGa_yN$, $Cu_xO$, $Cu_xS$, copper-indium-gallium-selenium (CIGS), $FeS_2$, $Fe_xO_y$, InP, NiS, $Zn_3P_2$, SnS, copper-zinc-tin-sulfur (CZTS), and PbS. In some embodiments, the thin semiconductor layer includes an organic semiconductor. In some embodiments, the organic semiconductor is selected from the group consisting of pentacene, poly(3-hexylthiophene) (P3HT), and [6,6]-phenyl-C61-butyric acid methyl ester (PCBM).

In some embodiments, the out of plane thickness of the top contact 314 allows gate fields to penetrate the top contact 314. In some embodiments, the gate 316 is configured to tune the electrical properties of the top contact 314, so as to alter the interface between the top contact 314 and the semiconductor layer 312. The top contact of any of the other devices described herein may include the materials and configurations described above.

Figure 4:
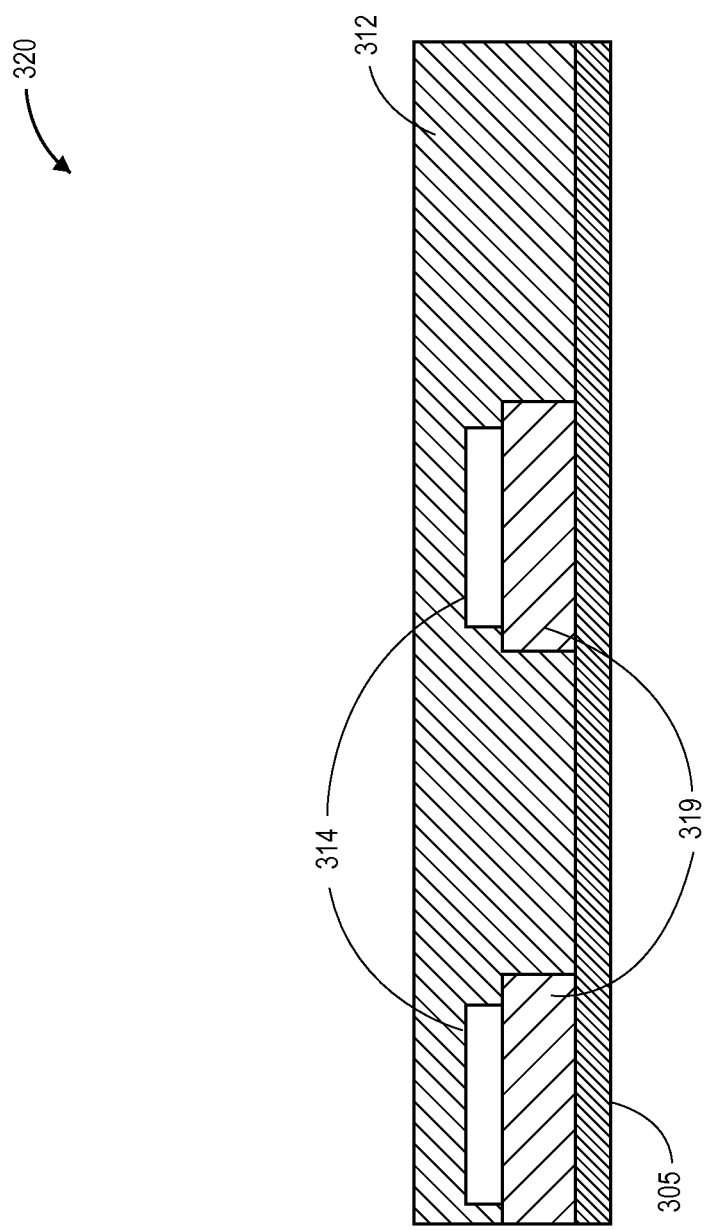
FIG. 4 shows an example of a cross-sectional schematic illustration of a back contact field-effect p-n junction.

FIG. 4 shows an example of a cross-sectional schematic illustration of a back contact field-effect p-n junction. In some embodiments, a field-effect p-n junction 320 may be similar to the field-effect p-n junction 300 shown in FIG. 3. As shown in FIG. 4, in some embodiments the field-effect p-n junction 320 includes a contact 305. Separate strips of layer 319 are disposed on the contact 305, with top contacts 314 disposed on each of the separate layers 319. In some embodiments, the separate strips of the layer 319 may include dielectric layer or an electrolyte.

The layers 319 are spaced apart from each other, accounting for depletion widths and minority carrier diffusion lengths of the semiconductor layer 312. For example, in some embodiments, the layers 319 may be spaced from each other by about 0.1 microns to 100 microns. The contact 305 may be metal. For example, the contact may include Cr, Cu, Ni, Fe, In, Au, Al, Ag, C, Ti, Mg, Mn, and Zn. The contact 305 may function as both a gate contact (e.g., in regions having the layers 319 disposed thereon) and as an ohmic contact (e.g., in regions not having the layer 319 disposed thereon).

Figure 5:
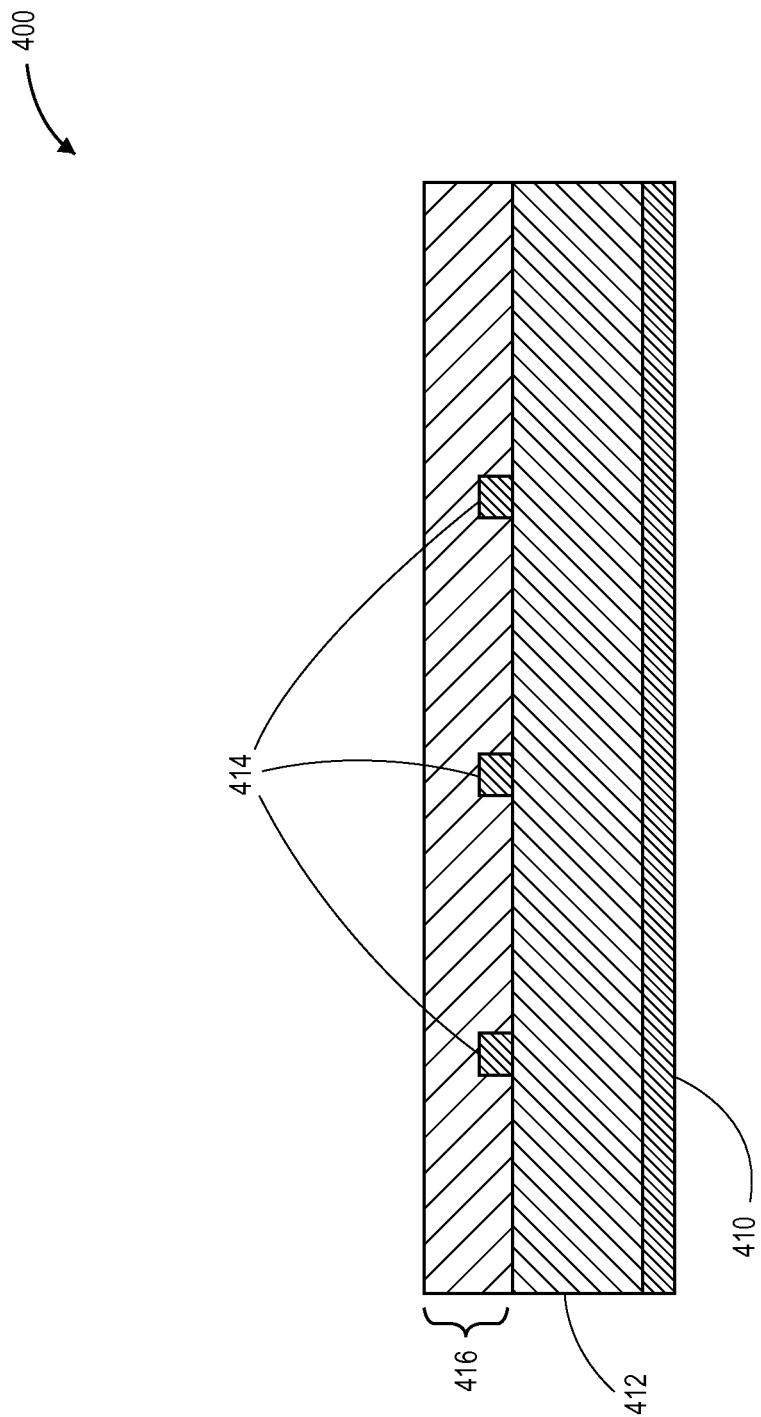
FIGS. 5 and 6 show examples of cross-sectional schematic illustrations of field-effect p-n junctions.

FIG. 5 shows an example of a cross-sectional schematic illustration of a field-effect p-n junction. As shown in FIG. 5, in some embodiments a field-effect p-n junction 400 includes an ohmic contact 410, a semiconductor layer 412 disposed on the ohmic contact 410, at least one rectifying contact 414 disposed on the semiconductor layer 412, and a gate 416 disposed on the semiconductor layer 412 and the rectifying contacts 414. The lateral width of the rectifying contacts 414 is less than the semiconductor depletion width of the semiconductor layer 412. The gate 416 includes a material having an electric charge or a polarization that produces an effective gate electric field of the gate 416.

In some embodiments, the electric charge in the material includes fixed interfacial charges (e.g., in a dielectric or an electrolyte). In some embodiments, the electric charge in the material includes fixed bulk charges (e.g., in a dielectric or an electrolyte). In some embodiments, the electrolyte includes an ionic liquid. In some embodiments, the ionic liquid includes 1-ethyl-3-methylimidazolium bis(trifluoromethyl-sulphonyl)imide ([EMIM] [TFSI] or EMI-BTI).

In some embodiments, the gate 416 includes a ferroelectric material. In some embodiments, the electric charge in the ferroelectric material includes a surface charge. In some embodiments, the ferroelectric material is selected from the group consisting of perovskites, tungsten bronze type compounds, bismuth oxide layered materials, organic ferroelectrics, and ceramic organic composite ferroelectrics.

The material having an electric charge of any of the other devices disclosed herein may also include any of the electric charge materials described above.

In some embodiments, the layer 219 of the field-effect p-n junction 200 shown in FIG. 1A may include a material having an electric charge or polarization (e.g., one of the materials described with respect to FIG. 5) that produce an effective gate electric field of the gate 216.

Figure 6:
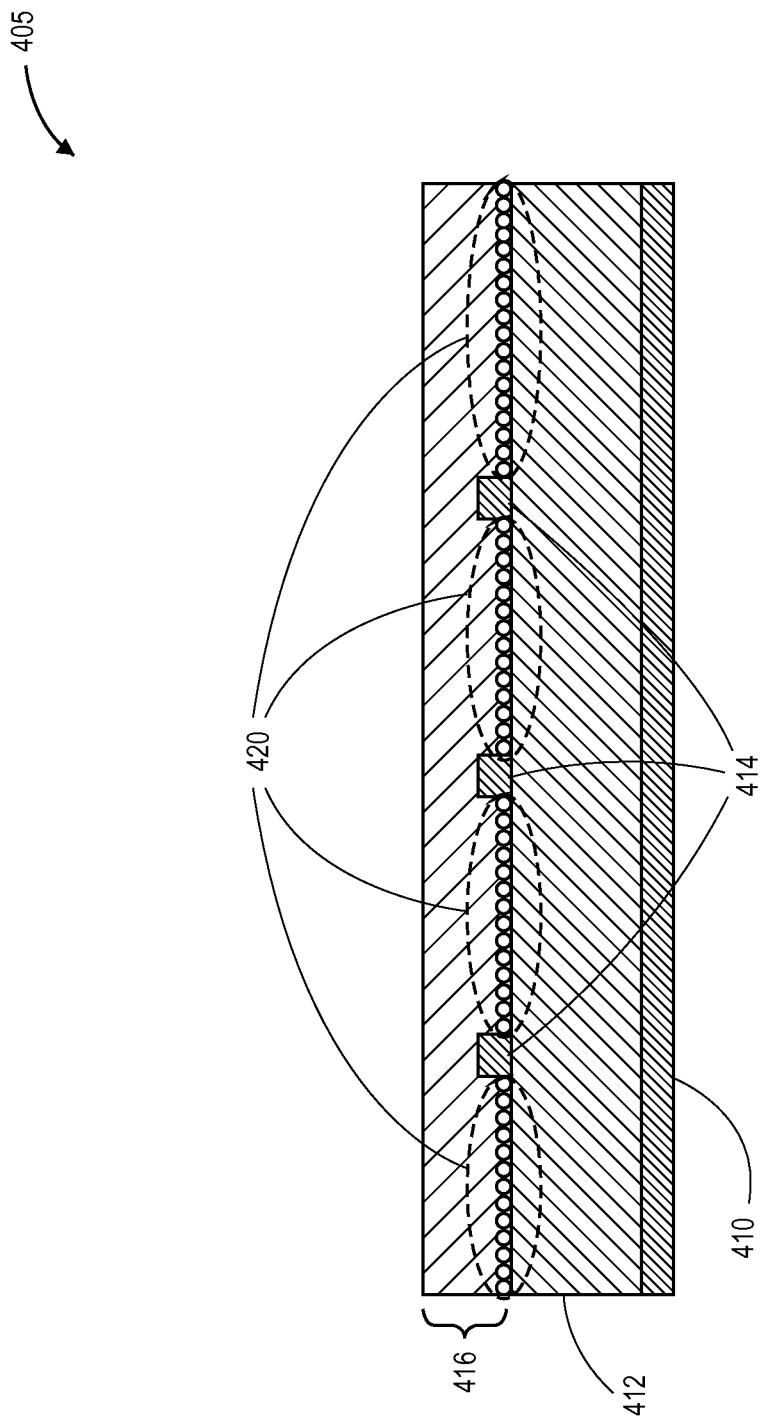

FIG. 6 shows an example of a cross-sectional schematic illustration of a field-effect p-n junction. In some embodiments, a field-effect p-n junction 405 shown in FIG. 6 may be similar to the field-effect p-n junction 400 shown in FIG. 5, with the addition of treating agents 420. The treating agents 420 are disposed between the semiconductor layer 412 and the gate 416. The treating agents 420 are configured to introduce additional band bending in the semiconductor layer 412. In some embodiments, the treating agents 420 are selected from the group consisting dopants in the semiconductor layer 412 (e.g., Ce or other elemental dopants), self-assembled monolayers with organic components disposed on the semiconductor layer 412, and self-assembled monolayers with inorganic components disposed on the semiconductor layer 412.

In embodiments in which the layer 219 of the field-effect p-n junction 200 shown in FIG. 1A includes a material having an electric charge, the field-effect p-n junction 200 may further include treating agents disposed between the semiconductor layer 212 and the gate 216. The treating agents are configured to introduce additional band bending in the semiconductor layer 212. In some embodiments, the treating agents are selected from the group consisting dopants in the semiconductor layer 212 (e.g., Ce or other elemental dopants), self-assembled monolayers with organic components disposed on the semiconductor layer 212, and self-assembled monolayers with inorganic components disposed on the semiconductor layer 212.

Figure 7:
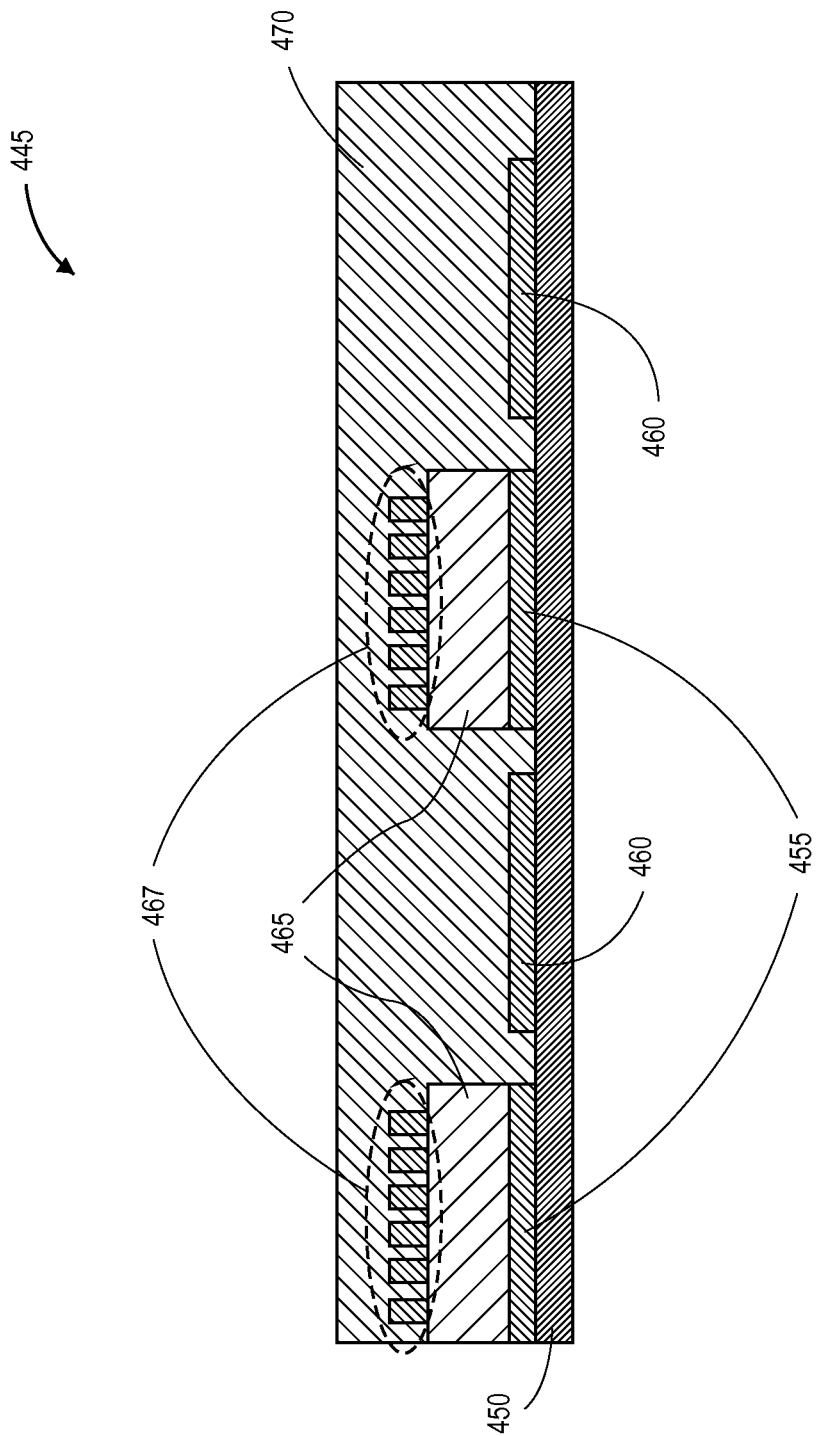
FIG. 7 shows an example of a cross-sectional schematic illustration of a back contact field-effect p-n junction.

FIG. 7 shows an example of a cross-sectional schematic illustration of a back contact field-effect p-n junction. As shown in FIG. 7, is some embodiments a field-effect p-n junction 445 includes an insulating substrate 450 with strips of a gate contact 455 and strips of an ohmic bottom contact 460 disposed thereon. In some embodiments, the widths of each of the gate contacts 455 and the ohmic bottom contacts 460 may be about 0.1 microns to 100 microns. In some embodiments, the insulating substrate 450 may include inorganic insulators such as $Al_2O_3$, $SiO_2$, $Si_3N_4$, $SiO_xN_y$, $SiN_y$, $Ta_2O_5$, $SrTiO_3$, $HfO_2$, and $MgF_2$, or organic insulators such as poly(methyl methacrylate (PMMA), polyethyleneimine (PEI), and polystyrene (PS). The strips of the gate contact 455 and strips of the ohmic bottom contact 460 are spaced to account for depletion widths and minority carrier diffusion lengths of the semiconductor layer 470. For example, in some embodiments, the spacing between the strips of the gate contact 455 and strips of the ohmic bottom contact 460 may be about 0.1 microns to 100 microns. Disposed on the strips of the gate contact 455 is a material 465 having an electric charge that produces an effective gate electric field of the gate. Disposed on the material 465 are rectifying contacts 467. In some embodiments, treating agents (not shown) may be disposed proximate an interface between the semiconductor layer 470 and the surface of the material 465 on which the rectifying contacts 467 are disposed.

Figure 8A:
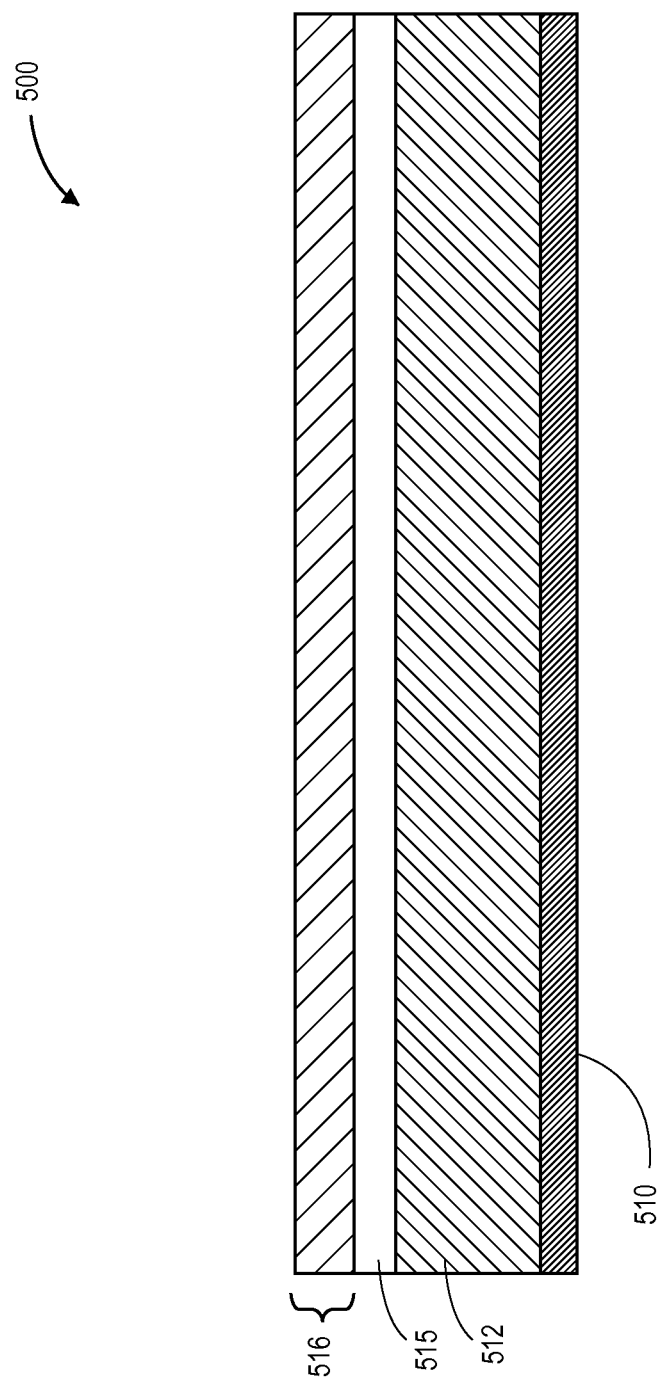
FIG. 8A shows an example of a cross-sectional schematic illustration of a field-effect p-n junction.

FIG. 8A shows an example of a cross-sectional schematic illustration of a field-effect p-n junction. As shown in FIG. 8A, in some embodiments a field-effect p-n junction 500 includes an ohmic contact 510, a semiconductor layer 512 disposed on the ohmic contact 510, a top contact 515 disposed on the semiconductor layer 512, and a gate 516 disposed the top contact 515. The out of plane thickness of the top contact 515 is less than the Debye screening length of the top contact 515. The gate 516 includes a material having an electric charge or a polarization that produces an effective gate electric field of the gate 516.

Figure 8B:
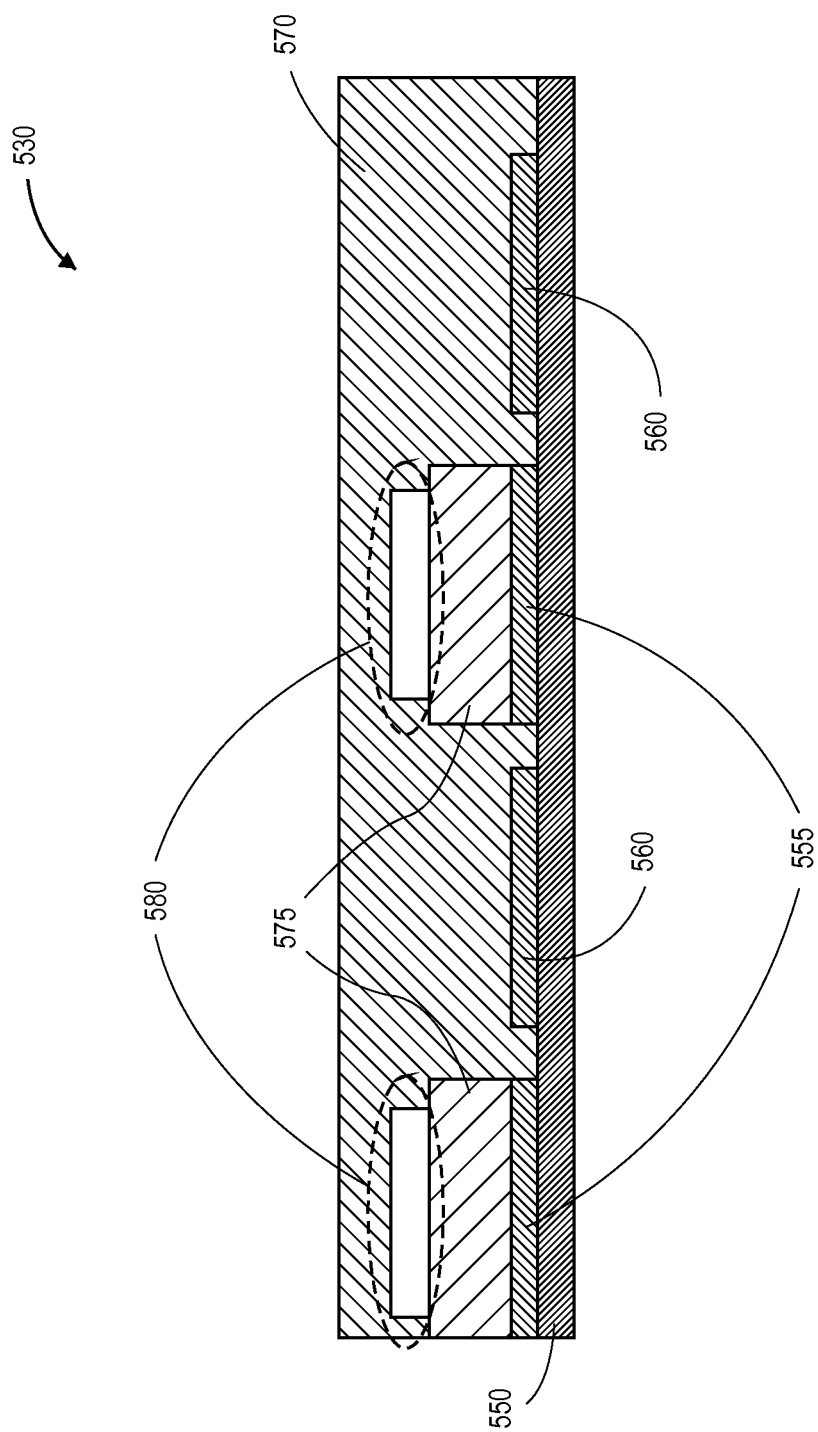
FIG. 8B shows an example of a cross-sectional schematic illustration of a back contact field-effect p-n junction.

FIG. 8B shows an example of a cross-sectional schematic illustration of a back contact field-effect p-n junction. In some embodiments, a field-effect p-n junction 530 shown in FIG. 8B may be similar to the field-effect p-n junction 445 shown in FIG. 7. As shown in FIG. 8B, is some embodiments the field-effect p-n junction 530 includes an insulating substrate 550 and strips of a gate contact 555 and strips of an ohmic bottom contact 560 disposed thereon. The strips of the gate contact 555 and strips of the ohmic bottom contact 560 are spaced to account for depletion widths and minority carrier diffusion lengths of the semiconductor layer 570. In some embodiments, the insulating substrate may include inorganic insulators such as $Al_2O_3$, $SiO_2$, $Si_3N_4$, $SiO_xN_y$, $SiN_y$, $Ta_2O_5$, $SrTiO_3$, $HfO_2$, and $MgF_2$ or organic insulators such as poly (methyl methacrylate (PMMA), polyethyleneimine (PEI), and polystyrene (PS). Disposed on the strips of the gate contacts 555 are layers 575. Disposed on the layer 575 are top contacts 580. In some embodiments, the layers 575 include a material having an electric charge that produces an effective gate electric field of the gate.

Figure 9A:
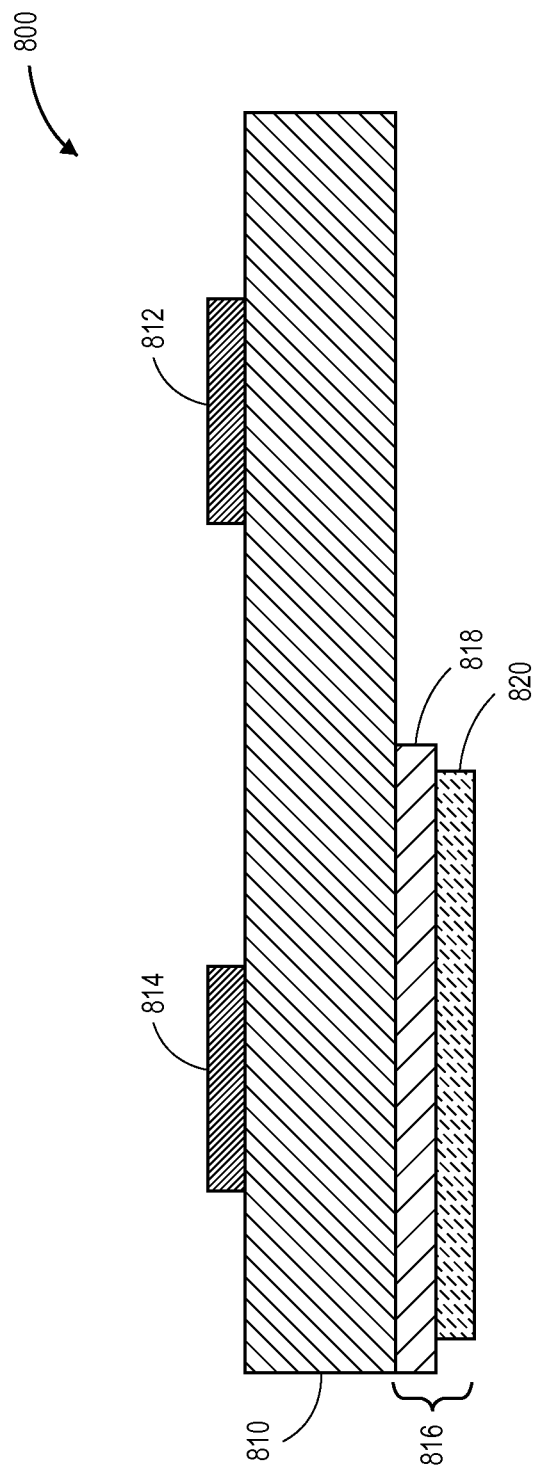
FIG. 9A shows an example of a cross-sectional schematic illustration of a field-effect p-n junction.
Figure 9B:
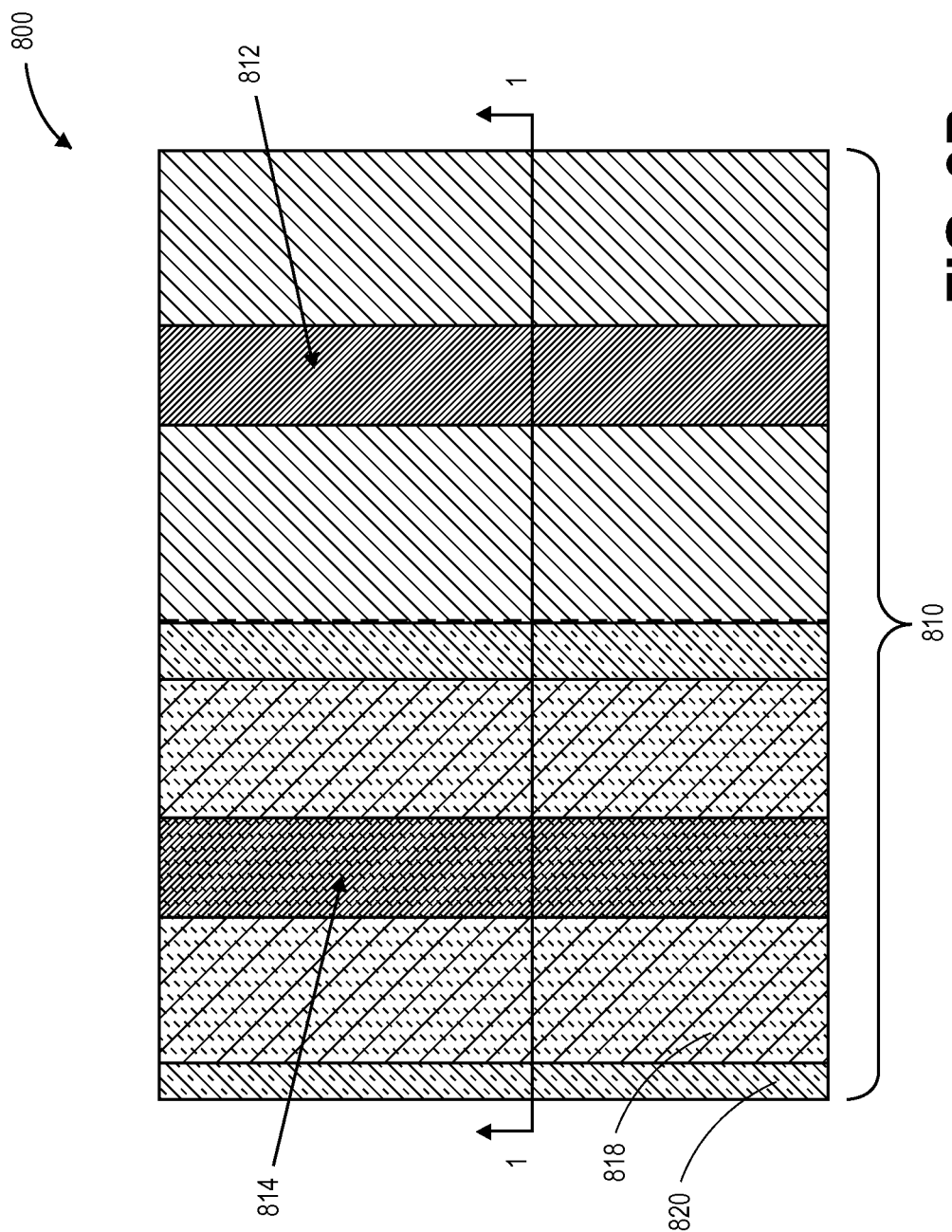
FIG. 9B shows an example of a top-down schematic illustration of the field-effect p-n junction shown in FIG. 9A.

FIG. 9A shows an example of a cross-sectional schematic illustration of a field-effect p-n junction. FIG. 9B shows an example of a top-down schematic illustration of the field-effect p-n junction shown in FIG. 9A. FIG. 9A is the cross-sectional view though line 1-1 of FIG. 9B. In FIG. 9B, layers of material are shown as being semi-transparent so that underlying layers can be seen. As shown in FIGS. 9A and 9B, in some embodiments a field-effect p-n junction 800 includes a semiconductor layer 810, an ohmic contact 812 disposed on a first side of the semiconductor layer 810, a rectifying contact 814 disposed on the first side of semiconductor layer 810, and a gate 816 disposed on a second side of the semiconductor layer 810 and aligned with the rectifying contact 814. "Aligned with," in this context, is meant to indicate that the gate 816 and the rectifying contact 814 oppose each other or mirror each other on the two sides of the semiconductor layer 810. The gate 816 includes a dielectric or electrolyte 818 disposed on the second side of the semiconductor layer 810 and a gate contact 820 disposed on the dielectric or electrolyte 818.

The thickness of the semiconductor layer 810 is about the semiconductor depletion length of the semiconductor layer 810. For example, in some embodiments, the semiconductor layer may be about 0.1 microns to 100 microns thick. The rectifying contact 814 is electrically isolated from the ohmic contact 812. The gate 816 is configured to create a non-shunted, gate-inverted current pathway through the semiconductor layer 810 from the rectifying contact 814 to the ohmic contact 812. In some embodiments, the ohmic contact 812 and the rectifying contact may be strips of material disposed on the first side of the semiconductor layer 810. In some embodiments, a distance of the rectifying contact 814 to the ohmic contact 812 may be about the minority carrier diffusion length in the semiconductor layer 810.

Figure 10:
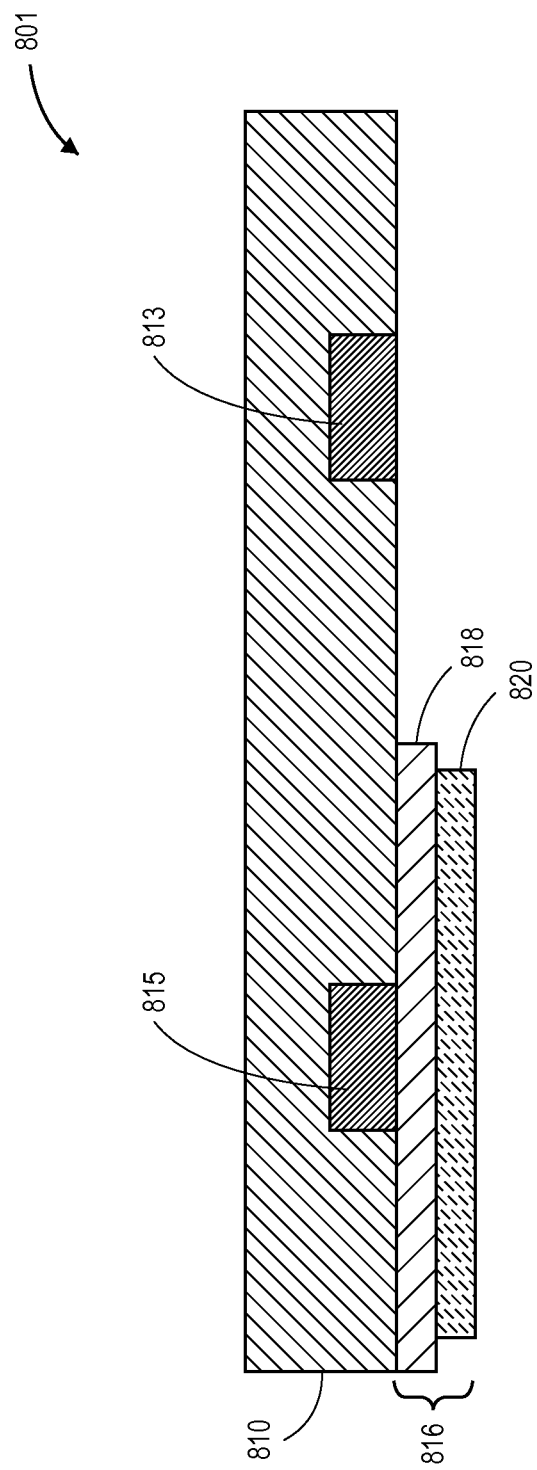

FIG. 10 shows an example of a cross-sectional schematic illustration of a field-effect p-n junction. In some embodiments, a field-effect p-n junction 801 shown in FIG. 10 may be similar to the field-effect p-n junction 800 shown in FIG. 9A. As shown in FIG. 10, in some embodiments the field-effect p-n junction 801 includes a semiconductor layer 810, an ohmic contact 813 embedded in a first side of the semiconductor layer 810, a rectifying contact 815 embedded in the first side of the semiconductor layer 810, and a gate 816 disposed on the first side of the semiconductor layer 810, overlying the rectifying contact 815. "Embedded," in this context, is meant to indicate that semiconductor processing techniques have been used to remove a portion of the semiconductor layer 810, and then deposition techniques have been used to fill the removed portions of the semiconductor layer 810 with material. The gate 816 includes a dielectric or electrolyte 818 disposed on the first side of the semiconductor layer 810 and a gate contact 820 disposed on the gate dielectric or electrolyte 818.

The thickness of the semiconductor layer 810 is about the semiconductor depletion length of the semiconductor layer 810. The rectifying contact 815 is electrically isolated from the ohmic contact 813. The gate 816 is configured to create a non-shunted, gate-inverted current pathway through the semiconductor layer 810 from the rectifying contact 815 to the ohmic contact 813. In some embodiments, a distance of the rectifying contact 815 to the ohmic contact 813 may be about the minority carrier diffusion length in the semiconductor layer 810.

Figure 11:
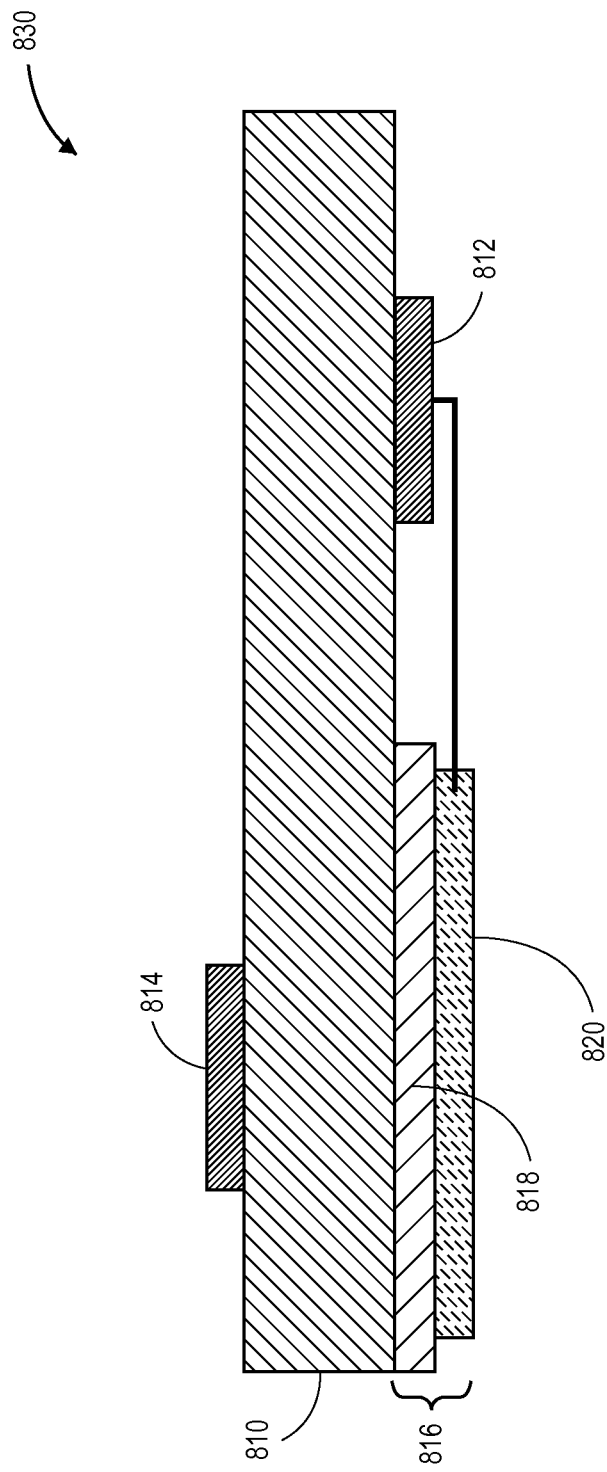

FIG. 11 shows an example of a cross-sectional schematic illustration of a field-effect p-n junction. As shown in FIG. 11, in some embodiments a field-effect p-n junction 830 includes a semiconductor layer 810, a rectifying contact 814 disposed on a first side of the semiconductor layer 810, an ohmic contact 812 disposed on a second side of the semiconductor layer 810, and a gate 816 disposed on the second side of the semiconductor layer 810 and aligned with the rectifying contact 814. The gate 816 includes a dielectric or electrolyte 818 disposed on the second side of the semiconductor layer 810 and a gate contact 820 disposed on the dielectric or electrolyte 818. The gate contact 820 may be electrically connected to the ohmic contact 812, resulting in a self-gating feedback loop that is configured to maintain a gate electric field of the gate 816.

The thickness of the semiconductor layer 810 is about semiconductor depletion length of the semiconductor layer 810. The rectifying contact 814 is electrically isolated from the ohmic contact 812. The gate 816 is configured to create a non-shunted, gate-inverted current pathway through the semiconductor layer 810 from the rectifying contact 814 to the ohmic contact 812. In some embodiments, a distance, not accounting for the thickness of the semiconductor layer 810, of the rectifying contact 814 to the ohmic contact 812 may be about the minority carrier diffusion length in the semiconductor layer 810.

FIG. 12 shows an example of a cross-sectional schematic illustration of a field-effect p-n junction. As shown in FIG. 12, in some embodiments a field-effect p-n junction 850 includes a semiconductor layer 810, a rectifying contact 814 disposed on a first side of the semiconductor layer 810, an ohmic contact 812 disposed on a second side of the semiconductor layer 810, and a material 822 disposed on the second side of the semiconductor layer 810 and aligned with the rectifying contact 814. The material 822 may include a material that includes an electric charge or polarization that produces an effective gate electric field in the p-n junction 850.

The thickness of the semiconductor layer 810 is about semiconductor depletion length of the semiconductor layer 810. The rectifying contact 814 is electrically isolated from the ohmic contact 812. In some embodiments, a distance, not accounting for the thickness of the semiconductor layer 810, of the rectifying contact 814 to the ohmic contact 812 may be about the minority carrier diffusion length in the semiconductor layer 810.

In some embodiments, the electric charge in the material 822 includes fixed interfacial charges (e.g., in a dielectric or an electrolyte). In some embodiments, the electric charge in the material 822 includes fixed bulk charges (e.g., in a dielectric or an electrolyte). In some embodiments, the material 822 includes a ferroelectric material. In some embodiments, the electric charge in the ferroelectric material includes a surface charge.

In some embodiments, the gate 816 of the field-effect p-n junctions 800, 801, and 830 shown in FIGS. 9, 10, and 11, respectively, may include a material 822, replacing the dielectric or electrolyte. The material 822 may produce an effective gate electric field of the gate 816.

Self-Gating and Fixed Charges

While the power consumed by the gate can be negligible, the requirement of an external gate power source applied to a third lead could increase the complexity and cost of a commercial SFPV device. Additionally, when connecting SFPV modules in series to boost the module voltage, the ground of all but the first cell needs to be floated and increased in steps of the cell operating voltage. As a result, the gate at subsequent cells also needs to increase in steps of the cell voltage. To solve these two issues, the cell output may be connected to the gate (e.g., as described above in the DEVICES section), resulting in the gate being self-powered with an appropriately floated ground. Self-gating can lead to a feedback loop which significantly increases the cell output, given appropriate choices of gate metal (e.g., having a work function near or above the semiconductor conduction band) and gate dielectric material and thickness. It is noted that this effective gating may also be applied through the use of dielectrics, electrolytes, ferroelectrics, or other materials with fixed bulk or surface charges at the interface with the semiconductor (e.g., as also described above in the DEVICES section). Additionally, these two strategies (a self-gating feedback loop and gate materials with fixed or surface charges) may be used in tandem to provide a more pronounced gating effect.

In one experiment, a type A SFPV with 250 nm wide Schottky (Cr) contacts, self-gating was demonstrated. For this cell, the solid dielectric was not used and the gate was applied using an ionic liquid (EMI-BTI). The cell was placed under AM1.5 illumination (i.e., the air mass coefficient that defines the direct optical path length through the Earth's atmosphere, which is commonly used to characterize the performance of solar cells under standardized conditions) with the gate initially held at ground. $V_{oc}$ versus time was plotted and the behavior when the gate was connected to the cell output (bottom electrode) was examined. Despite a non-optimal choice of gate dielectric and gate metal, a significant increase in Voc (5%) over the non-gated Schottky barrier configuration was observed.

This, along with the high efficiency predicted by simulations for an optimized self-gated SFPV, provides compelling evidence that SFPV represent a strong contender to realize commercially viable (high efficiency, low cost) photovoltaics.

Device Simulations

The following description of device simulations is offered for illustrative purposes, and is intended not to limit embodiments disclosed herein.

Simulations using COMSOL finite-elements software were used to solve the drift-diffusion-Poisson equations in the device structures. The simulations of finger devices (i.e., type A devices) were two-dimensional (assuming uniform extrusion in the third dimension), and had periodic boundary conditions to simulate an array of equally-spaced wires. The Poisson equation incorporates both the semiconductor and the gate insulator, with the three metal electrodes (gate, finger, and bottom) used to define the boundary conditions. Majority-carrier transport at the Schottky barriers was treated in the Crowell-Sze model [12], with the thermionic-emission barrier height taken at the semiconductor-metal interface. Image-force lowering of the Schottky barrier was taken into account by self-consistently changing the effective metal workfunction based on the local electric field [13]. Notably, the image-force lowering was often zero in the nanofinger devices (type A), due to the inverted sign of the electric field at the metal interface. Instead of modeling a back-surface field, recombination at the back contact was simply set to zero. The incident photon flux was equivalent to AM1.5, and the absorption profile was approximated by an absorption coefficient $\alpha=3\times10^3$ cm$^{-1}$. Shockley-Read-Hall (SRH) recombination was included with a lifetime of 100 µs. Auger recombination was negligible in these structures.

Type A, or nanofinger, electrodes were evaluated using the finite-element simulations with p-type Si ($n_A=10^{15}$/cm$^3$, 1 µm depletion width), a 100 nm thick SiO$_2$ gate dielectric, 10 µm semiconductor thickness, and a 5 µm separation between neighboring fingers. A doping of $10^{15}$/cm$^3$ was chosen as a middle-range value for practical photovoltaic devices. Changing the wafer doping a few orders of magnitude above or below this would change the scaling of the simulation. Increasing the spacing between nanofingers would increase series resistance and shading, while decreasing the spacing would increase saturation current, particularly when the spacing becomes less than the depletion width.

When the fingers are relatively wide, they screen out all effects of the gate underneath them, and the resulting shunt current path dominates the transport. However, with sufficiently narrow fingers, the gate field can spread under the electrode, creating a potential profile with a saddle point under the electrode. In order to travel from the bottom to top electrode, majority carriers climb over the saddle point, which forms a larger barrier than the normal Schottky barrier, directly lowering the diode saturation current and improving the solar-cell performance. An improvement in the cell with decreasing finger width w was observed. The improvement far exceeded the Voc~kT ln (w) relationship expected from macroscopic considerations alone [10]. As this example shows, electrode finger size was a primary factor controlling the size and presence of a saddle-point potential barrier. In general, for the effect to be strong, the finger needs to be significantly smaller than the depletion width in the semiconductor, as this is the length-scale over which the potential varies in the semiconductor. Another factor affecting the saddle-point barrier was bias, with forward bias (such as open-circuit) advantageously raising the barrier. Yet another factor was the intrinsic Schottky barrier; if the Schottky barrier started small, it was easier to enhance it with an extra saddle-point barrier.

Next, type B cells were considered, in which the partially screening electrode was a thin metallic or semi-metallic sheet. Graphene (mono- or few-layer) was used as the thin contact. Graphene is highly transparent (about 97.7%/layer) yet reasonably conductive (inter alia, making it one of the strongest candidates to replace indium tin oxide), and its low density-of-states near the charge neutral point allows electric fields to partially penetrate one or more layers [11]. Thus, graphene can act as a continuous, transparent top electrode but still allow electric fields to penetrate and deplete/invert the underlying semiconductor. The simulations of type B graphene devices aimed to solve several coupled equations to describe a self-consistent system. First, the graphene charge $Q_{gr}$ must equal the difference between the D-field in the gate insulator and the D-field at the surface of the silicon:

$$Q_{gr}/A = D_{gate} - D_{surf}$$

Second, the charge in the graphene alters graphene's workfunction:

$$\chi_{gr} = \chi_{cn-gr} + \hbar\ v_F|Q_{gr}/q|^{1/2}\text{sign}(Q_{gr})$$

where $v_F$ is the Fermi velocity and $\chi_{cn-gr}$ is the workfunction of charge-neutral graphene (i.e., the energy to bring an electron from the Dirac point to vacuum), which was approximated as 4.6 eV (assuming a Schottky-Mott band-bending relationship) [11.5]. Bilayer graphene was treated as two graphene sheets, each with its own workfunction, in a similar self-consistent approach. Its gate-response was smaller, since the top sheet helps screen the bottom sheet. Graphite was treated analogously, as the limit of infinitely many sheets. In all cases the extrinsic graphene/graphite doping was assumed to be zero. For a conventional metal, even when very thin, the density of states is so large that the workfunction is totally independent of charge state. For this reason, conventional metals would perfectly screen a gate, but graphene does so only partly. Third, the drift-diffusion-Poisson equations must be satisfied in the silicon. These equations have a boundary condition affected by $\chi_{gr}$, and in turn determine $D_{surf}$. Self-consistent solutions to these three coupled conditions were found by iteration. Potential profiles were generated as a function of depth into the silicon (n-type, $N_D=10^{15}$/cm$^3$). Monolayer graphene performed best, achieving a power conversion efficiency of about 19%, as might be expected since it permits the most field penetration. The simulation did not consider the limiting effect of the high sheet resistance of monolayer graphene, but this problem could be rectified using a mesh of metal busbars or by doping or functionalizing the graphene.

Device Fabrication and Testing

The following description is offered for illustrative purposes, and is intended not to limit embodiments disclosed herein. The devices described herein may be fabricated using standard semiconductor processing techniques as known by a person of ordinary skill in the art. The details of some processing techniques that may be used to fabricate some devices are given below.

Type A SFPV cells may be fabricated with Schottky (Cr) nanofinger contacts on $N_A \sim 10^{15}$ cm$^{-3}$ p-type Si. 250 nm wide contacts were used, chosen to be well below the ~1 μm Si depletion width, with a 20 μm lateral spacing. A top gate was formed with an additional 100 nm of electron-beam evaporated SiO$_2$ and a semitransparent (~50%) layer of Cr (2 nm) and Au (10 nm) as the gate metal.

More specifically, type A p-type Si cells also may be fabricated as follows. A NPGS-defined (A4 PMMA 950 resist) thick Cr—Au aperture and contact pads (5 nm Cr, 50 nm Au) were patterned onto a p-type Si wafer (~10$^{15}$/cm$^3$ 1-10 Ohm-cm, B-doped, 300 nm thermal oxide) in order to restrict light to only the central active region. The active region was created by patterning 200 μm×200 μm squares onto a polished side of p-type Si with 300 nm of thermally-grown oxide. The oxide was removed using a wet etch, 5:1 BHF for four minutes, revealing a 200 μm×200 μm area of p-type Si. The active region was then contacted using 250 nm wide fingers (200 μm long, lateral spacing at a period of 5 μm), thermally evaporated at an angle of 45 degrees onto the substrate in order to maintain continuity at the step edge of the SiO$_2$, connecting the fingers to the SiO$_2$-supported contact pad. The fingers were composed of Cr—Au (5 nm Cr, 50 nm Au) to test the gate response of Schottky to the p-type Si. A top gate was fabricated by electron-beam evaporating 120 nm of SiO$_2$ on the entire chip and then patterning a thin metal (2 nm Cr, 12 nm Au—about 50% transparent) layer over the active region. An Ohmic back contact was fabricated by removing the SiO$_2$ with 5:1 BHF and thermally evaporating 70 nm Al.

The fingers were held at ground and the gate was held at a fixed voltage while the bias voltage (bottom contact) was varied. A positive gate voltage repels holes in the top layer of the p-type Si and pulls in electrons through the fingers. With the cell under illumination, Voc, Isc, and the FF all increased monotonically with increasing positive gate voltage. $R_{sh}$ also appears to decrease with increasing gate voltage. Positive gating improved the performance of the Schottky junction. Furthermore, the gate leakage current (1 nA at Vg=2V) was several orders of magnitude lower than the cell output current; once established, the gate field took negligible power to maintain. To estimate the maximum efficiency of this cell, the light into the active area was limited using a lithographically-defined aperture (5 nm Cr, 100 nm Au) which blocked greater than 99% of visible light around the active region. However, the gate and finger contacts transmitted about 50% of visible light, so the active area was estimated to be 200 μm×200 μm+0.5*(200×200)=6*10$^{-4}$ cm$^2$ with a maximum device efficiency of about 6% with Vg=2V. Note that several variables may be adjusted to achieve better performance, such as finger spacing, the antireflective coating, and surface texturing. Most significantly, the unfired Al back contact may form a poor Ohmic contact to the low-doped Si, resulting in an opposing Schottky diode that reduces the operating voltage by a few tenths of a volt and significantly reduces the ultimate efficiency.

It was demonstrated that the Schottky contact can be gated into an effectively Ohmic contact. A negative gate voltage decreased Voc, consistent with lowering of the effective Schottky barrier. Eventually, a sufficiently negative gate voltage shrinks the depleted region adjacent to the finger enough to provide a direct shunt path through the cell.

Type B cells may be fabricated using chemical vapor deposition (CVD) grown graphene as the top contact. Single layer graphene (SLG) was brought in contact with n-type Si ($N_D \sim 10^{16}$ cm$^{-3}$) and was contacted using shadow-mask defined evaporated Cr—Au contacts. A gate field was applied using an ionic liquid (EMI-BTI) and an external Cu probe.

More specifically, type B graphene on n-Si cells also may be produced as follows. A n-type Si wafer (~10$^{16}$/cm$^3$ 1-10 Ohm-cm, P-doped) with 100 nm thermal oxide was covered with PMMA resist, and a 2 mm×2 mm square was exposed. 5:1 BHF was used to etch the SiO$_2$ within this square. Graphene was grown by low pressure CVD on Cu following a modified 2-stage recipe [14]. PMMA-supported graphene was then draped over the exposed Si. The PMMA used for transfer was removed in acetone, and a copper shadow mask was then used to evaporate a Cr—Au contact to the graphene (making sure to contact the graphene in a region where it is resting on SiO$_2$). An Ohmic back contact was fabricated by removing the backside SiO$_2$ with 5:1 BHF and thermally evaporating 70 nm Al. "Bilayer" samples were fabricated by repeating the monolayer graphene transfer onto existing single layer samples.

The graphene was held at ground and the gate was held at a fixed voltage while the bias voltage (bottom contact) was varied. A negative gate voltage repelled electrons in the top layer of the n-type Si and pulled in electrons through the graphene. A modest gate voltage (and negligible gate power) significantly enhanced Voc, Isc, and the fill factor, increasing PCE from 0.5% with Vg=0.0V to 1.8% with Vg=1.2V.

One barrier to performance in this device is likely the high series resistance of SLG. To test this, a second layer of SLG was transferred onto the device, thus creating a "bilayer" graphene top electrode. While the series resistance decreased and fill factor improved with addition of the second layer, this device was not as easily improved by gating. This can be attributed to the formation of ripples and folds in the second layer of graphene which locally inhibit the effect of the gate and act as shunt paths. A true as-grown graphene bilayer device would likely not exhibit these effects.

CONCLUSION

Further description of the subject matter described herein may be found in the publication "Screening-Engineered Field-Effect Solar Cells," by William Regan, Steven Byrnes, Will Gannett, Onur Ergen, Oscar Vazquez-Mena, Feng Wang, and Alex Zettl, Nano Letters 2012, 12, 4300-4304, which is herein incorporated by reference.

It is to be understood that the above description and examples are intended to be illustrative and not restrictive. Many embodiments will be apparent to those of skill in the art upon reading the above description and examples. The scope of the invention should therefore be determined not with reference to the above description and examples, but should instead be determined with reference to the appended claims, along with the full scope of equivalents to which such claims are entitled. The disclosures of all articles and references, including patent applications and publications, are incorporated herein by reference.

REFERENCES

[1] H. Koinuma et al. Mater. Res. Soc. Symp. Proc. 426, 95 (1996).
[2] G. De Cesare et al. Thin Solid Films 427, 166 (2003).

[3] C. Wadia et al. Environ. Sci. Technol. 43, 2072 (2009).
[4] R. B. Godfrey and M. A. Green. Appl. Phys. Lett. 34, 790-793 (1979).
[5] N. G. Gomaa. Renewable Energy 24, 529 (2001).
[6] D.-K. Yeh and T. A. DeMassa. Solid-State Electronics 27 (3) 283 (1984).
[7] V. Yu. Yerokhov and I. I. Melnyk. Solid-State Electronics 42 (6), 883 (1998).
[8] P. Wadhwa et al. Nano Letters 10(12), 5001 (2010).
[9] P. Wadhwa et al. Nano Letters 11(6), 4219 (2011).
[10] M. A. Green. Appl. Phys. Lett. 27, 287 (1975).
[11] X. Li et al. Nano Letters 9(12), 4359 (2009).
[11.5] Y.-J. Yu et al. Nano Letters 9(10), 3430 (2009).
[12] C. R. Crowell and S. M. Sze. Solid-State Electronics 9, 1035 (1966).
[13] S. M. Sze and K. K. Ng. Physics of Semiconductor Devices 3rd ed. Wiley-Interscience: Hoboken, 2007.
[14] X. Li et al. Nano Letters 10, 4328 (2010).

What is claimed is:

1. A device comprising:
a semiconductor layer, a thickness of the semiconductor layer being comparable to a semiconductor depletion width of the semiconductor layer;
an ohmic contact disposed on a first side of the semiconductor layer;
a rectifying contact disposed on the first side the semiconductor layer, the rectifying contact being electrically isolated from the ohmic contact; and
a gate including a layer disposed on a second side of the semiconductor layer and an electrode disposed on the layer, the gate being aligned with the rectifying contact, the gate being configured to create a non-shunted, gate-inverted current pathway through the semiconductor layer from the rectifying contact to the ohmic contact.

2. The device of claim 1, wherein the semiconductor layer comprises an inorganic semiconductor.

3. The device of claim 1, wherein the rectifying contact comprises a metal, a semi-metal, or a semiconductor.

4. The device of claim 1, wherein the layer comprises an inorganic dielectric material.

5. The device of claim 1, wherein the gate contact is electrically connected to the ohmic contact to create a self-gating feedback loop that is configured to maintain a gate electric field of the gate.

6. The device of claim 1, wherein the layer comprises a material including an electric charge configured to produce an effective gate electric field of the gate.

7. The device of claim 6, wherein the layer comprises a ferroelectric material.

* * * * *